(12) United States Patent
Arnold et al.

(10) Patent No.: US 8,586,482 B2
(45) Date of Patent: Nov. 19, 2013

(54) FILM STACK INCLUDING METAL HARDMASK LAYER FOR SIDEWALL IMAGE TRANSFER FIN FIELD EFFECT TRANSISTOR FORMATION

(75) Inventors: John C. Arnold, North Chatham, NY (US); Sivananda K. Kanakasabapathy, Niskayuna, NY (US); Stefan Schmitz, Malta, NY (US); Yunpeng Yin, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 205 days.

(21) Appl. No.: 13/171,868

(22) Filed: Jun. 29, 2011

(65) Prior Publication Data

US 2013/0001750 A1    Jan. 3, 2013

(51) Int. Cl.
*H01L 21/311* (2006.01)

(52) U.S. Cl.
USPC ............... 438/706; 257/618; 257/E21.314

(58) Field of Classification Search
USPC .................... 257/618, E21.314; 438/706
See application file for complete search history.

(56) References Cited

U.S. PATENT DOCUMENTS

| | | | |
|---|---|---|---|
| 6,424,011 B1 * | 7/2002 | Assaderaghi et al. | 257/350 |
| 6,875,703 B1 | 4/2005 | Furukawa et al. | |
| 6,987,289 B2 | 1/2006 | Nowak | |
| 7,315,994 B2 | 1/2008 | Aller et al. | |
| 7,335,930 B2 | 2/2008 | Furukawa et al. | |
| 7,351,666 B2 | 4/2008 | Furukawa et al. | |
| 7,381,655 B2 | 6/2008 | Furukawa et al. | |
| 7,439,144 B2 | 10/2008 | Doris et al. | |
| 7,585,614 B2 | 9/2009 | Furukawa et al. | |
| 7,771,604 B2 | 8/2010 | Furukawa et al. | |
| 7,847,323 B2 | 12/2010 | Cheng et al. | |
| 2006/0024945 A1 * | 2/2006 | Kim et al. | 438/618 |
| 2008/0200001 A1 * | 8/2008 | Clavelier et al. | 438/305 |
| 2010/0248481 A1 | 9/2010 | Schultz | |
| 2011/0014786 A1 | 1/2011 | Sezginer et al. | |
| 2012/0244711 A1 * | 9/2012 | Yin et al. | 438/703 |
| 2012/0329268 A1 * | 12/2012 | Soda et al. | 438/631 |

* cited by examiner

*Primary Examiner* — Thomas L Dickey
(74) *Attorney, Agent, or Firm* — Cantor Colburn LLP; Matthew Zehrer

(57) ABSTRACT

A method for formation of a fin field effect transistor (FinFET) device includes forming a mandrel mask on a metal hardmask layer of a film stack, the film stack including a silicon on insulator (SOI) layer located underneath the metal hardmask layer; forming a large feature (FX) mask on the metal hardmask layer; etching the mandrel mask and the FX mask simultaneously into the metal hardmask layer; etching the mandrel mask and the FX mask into the SOI layer using the etched metal hardmask layer as a mask.

20 Claims, 48 Drawing Sheets

1900

FORM MANDREL MASK AND FX MASK ON METAL HARDMASK LAYER
1901

ETCH MANDREL MASK AND FX MASK INTO METAL HARDMASK LAYER
1902

ETCH MANDREL MASK AND FX MASK INTO SOI USING ETCHED METAL HARDMASK LAYER AS MASK; REMOVE METAL HARDMASK LAYER
1903

FORM CUT MASK ON DEVICE; ETCH CUT MASK INTO SOI
1904

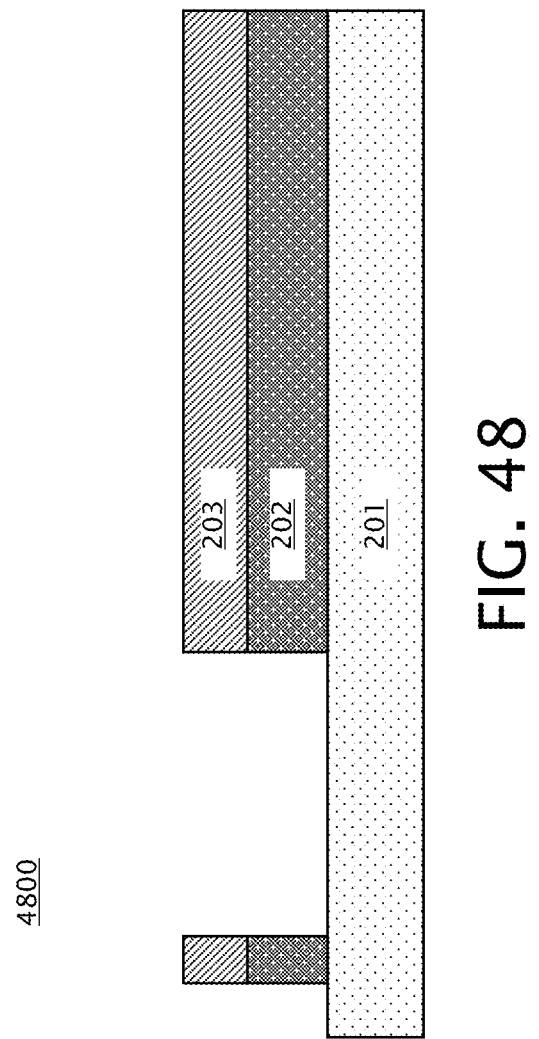

FILM STACK INCLUDING METAL HARDMASK LAYER FOR SIDEWALL IMAGE TRANSFER FIN FIELD EFFECT TRANSISTOR FORMATION

BACKGROUND

This disclosure relates generally to the field of semiconductor device fabrication, and more particularly to fabrication of devices including fin field effect transistors (FinFETs) by sidewall image transfer (SIT).

The need to remain cost and performance effective in the production of semiconductor devices has caused continually increasing device density in integrated circuits. To facilitate the increase in device density, new technologies are constantly needed to allow the feature size of such semiconductor devices to be reduced. The push for ever increasing device densities in particularly strong in complementary metal-oxide-semiconductor (CMOS) devices such as field effect transistors (FETs). FETs are used in many types of integrated circuit (IC) design (i.e., microprocessors, memory, etc.). Unfortunately, increased devices density of FETs may result in degradation of device performance or reliability.

One type of FET that has been proposed to facilitate increased device performances is the FinFET. In a FinFET, a vertical fin structure is defined to form the body of the transistor. The fin structures may be formed on a substrate including a silicon on insulator (SOI) substrate. Gates stacks are then deposited on both sides and the top of the fin structures. The fin structures and/or gates may be defined by a technique referred to as sidewall image transfer (SIT). In one example of SIT, mandrels are formed on top of a thermal silicon oxide layer that is located above the SOI layer. A conformal SIT spacer is then formed over the mandrels, the spacer is etched back to expose the top surfaces of the mandrels, and the mandrels are removed, leaving the portion of the SIT spacer that was located on the mandrel sidewalls. During the SIT process, the thermal silicon oxide layer may be damaged. Any fluctuation in the thermal silicon oxide layer thickness at the end of the SIT process result in erosion of the fin structure during etching of the FinFET gate. Eroded fins might be difficult to merge together during subsequent epitaxial processing. Further, for a replacement gate integration scheme, a relatively thin layer of thermal silicon oxide (e.g., about 3 nanometers thick) on top of the SOI is required, which requires strict control of the thermal oxide thickness variation during the SIT etching. In the case SIT using a polysilicon mandrel, the thermal silicon oxide may be sloped after the polysilicon mandrel etch. In the case of SIT using an amorphous carbon mandrel, the thermal silicon oxide may be partially etched and result in thickness variations at the end of fin formation. Further, there is a risk that the thermal silicon oxide will be exposed during SIT spacer removal, so there is a risk that the thermal silicon oxide will be punched through during subsequent processing steps.

BRIEF SUMMARY

In one aspect, a method for formation of a fin field effect transistor (FinFET) device includes forming a mandrel mask on a metal hardmask layer of a film stack, the film stack including a silicon on insulator (SOI) layer located underneath the metal hardmask layer; forming a large feature (FX) mask on the metal hardmask layer; etching the mandrel mask and the FX mask simultaneously into the metal hardmask layer; etching the mandrel mask and the FX mask into the SOI layer using the etched metal hardmask layer as a mask.

In another aspect, a film stack for formation of a fin field effect transistor (FinFET) device includes a buried oxide (BOX) layer; a silicon on insulator (SOI) layer located on the BOX layer; a thermal silicon oxide layer located on top of the SOI layer; an amorphous carbon layer located on top of the thermal silicon oxide layer; and a metal hardmask layer located on top of the amorphous carbon layer.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES:

FIG. 48 is a cross sectional view illustrating an embodiment of the device of FIG. 47 after removal of the OPL.

DETAILED DESCRIPTION

Embodiments of a method for FinFET formation using SIT and a film stack including a metal hardmask layer, and a film stack including a metal hardmask layer for SIT FinFET formation, are provided, with exemplary embodiments being discussed below in detail. FinFET formation may be performed by etching a plurality of masks, including a mandrel mask for SIT, into the metal hardmask layer, and using the etched metal hardmask layer to transfer the plurality of masks into the SOI simultaneously. The plurality of masks may include the mandrel mask used for SIT, a large feature (FX) mask, and a cut mask (used to remove unnecessary features formed by previously applied masks). In some embodiments, the cut mask may be formed on the metal hardmask layer before the mandrel and FX masks are etched into the metal hardmask layer; in other embodiments, the cut mask may be formed on the device after the mandrel and FX masks are etched into the SOI. By transferring the plurality of masks into the SOI in a reduced number of etching steps, it is possible to maintain the integrity of the thermal silicon oxide layer that is located on top of the SOI. Therefore, a more robust process window is available during the SIT process, including mandrel etch, spacer etch, and spacer removal steps. A device fabrication process using SIT and a film stack including a metal hardmask layer may be used to form FinFETs having a pitch of about 80 nanometers or less (about 40 nanometers or less in some exemplary embodiments) with a relatively high process yield with a relatively high process yield, due to low thermal silicon oxide thickness variation. SIT in conjunction with a film stack including a metal hardmask layer may be used for both gate and fin SIT applications.

Figure 1:
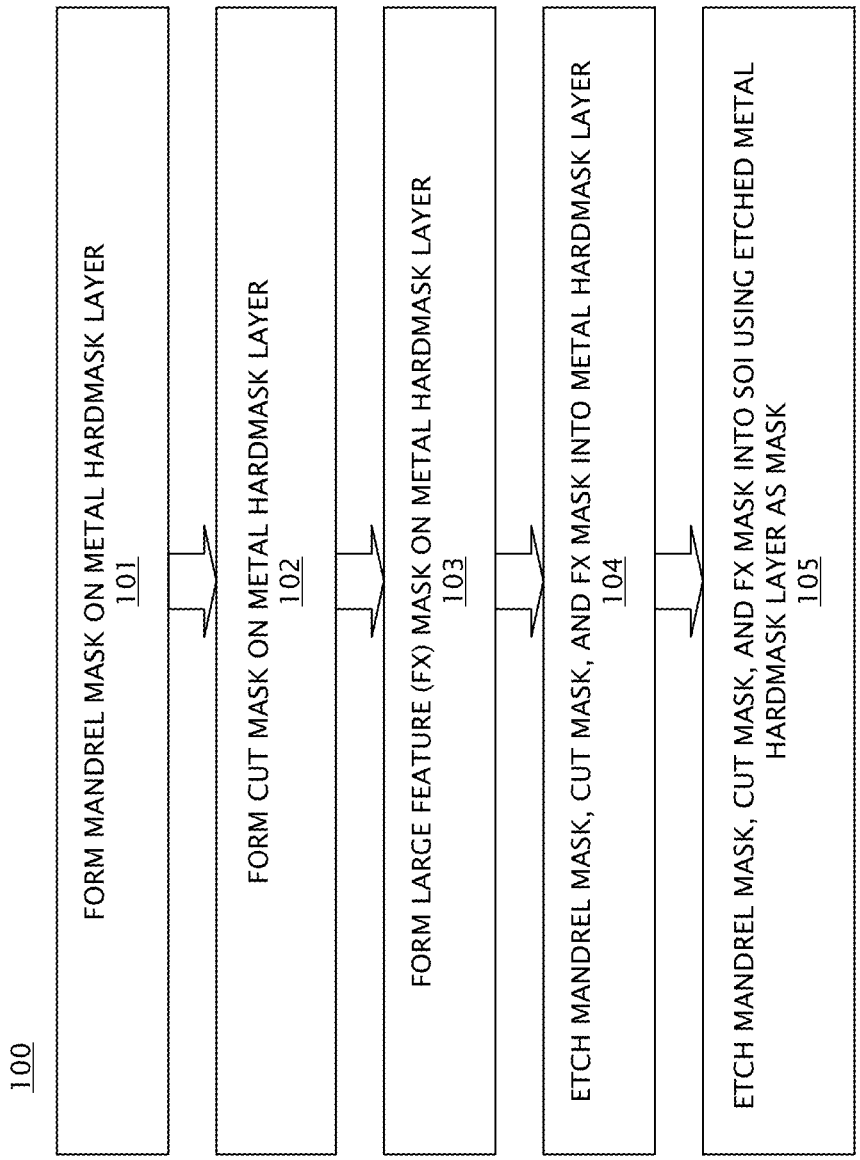
FIG. 1 illustrates a flowchart of an embodiment of a method for FinFET formation using SIT and a film stack including a metal hardmask layer.
Figure 2:
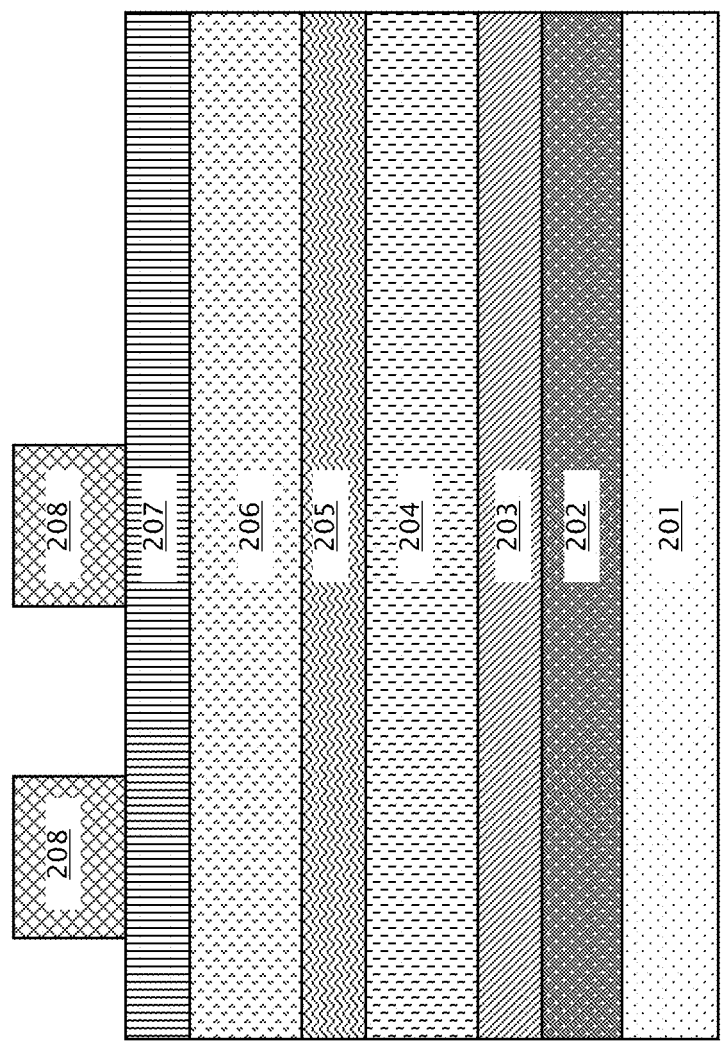
FIG. 2 is a cross sectional view illustrating an embodiment of a film stack including a metal hardmask layer after deposition of an organic planarization layer (OPL), silicon antireflective coating (SiARC), and photoresist corresponding to a mandrel mask.
Figure 3:
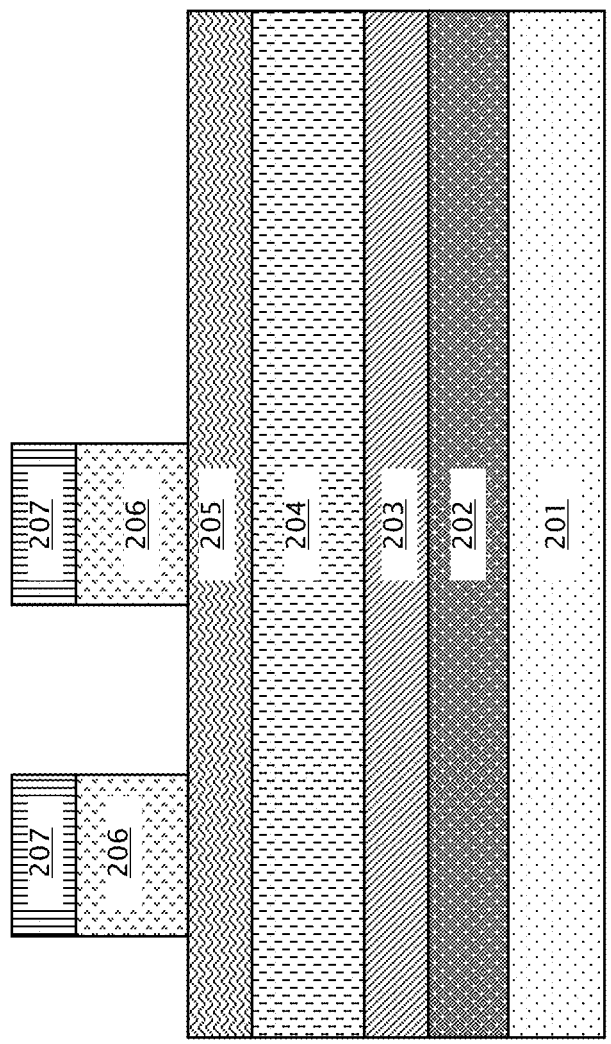
FIG. 3 is a cross sectional view illustrating an embodiment of the device of FIG. 2 after etching the OPL and the SiARC using the photoresist as a mask.
Figure 4:
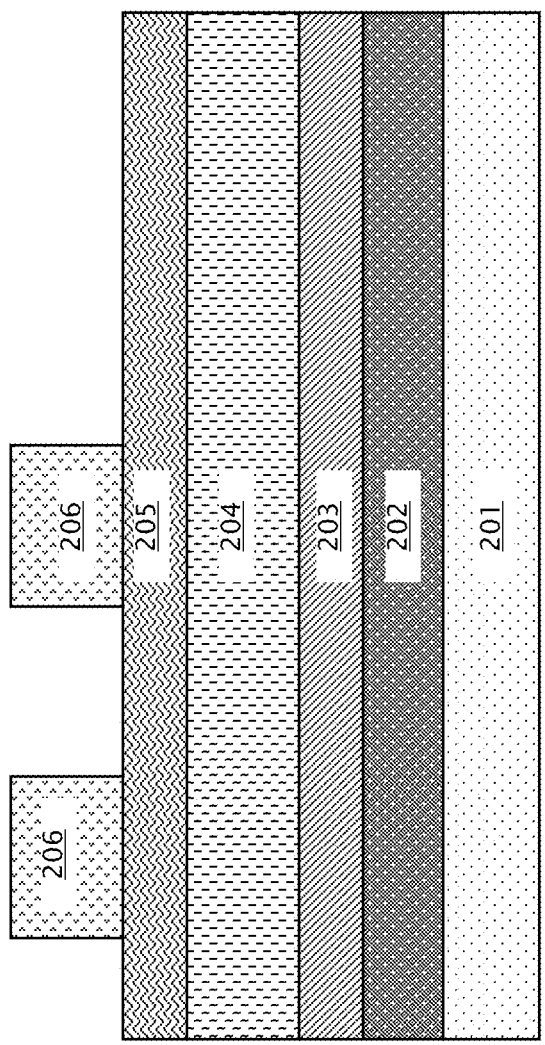
FIG. 4 is a cross sectional view illustrating an embodiment of the device of FIG. 3 after removing the SiARC.
Figure 5:
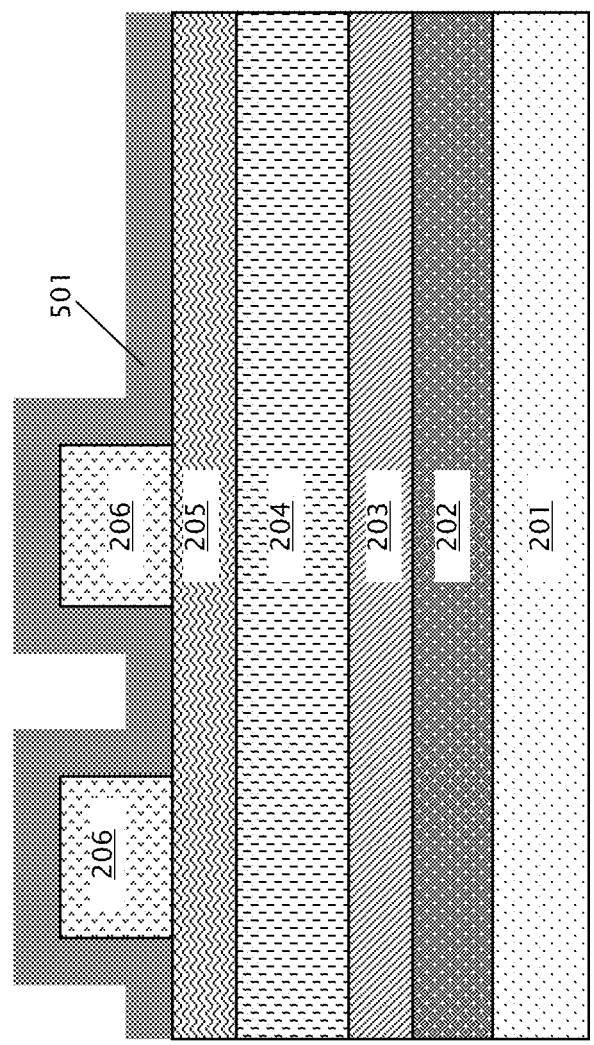
FIG. 5 is a cross sectional view illustrating an embodiment of the device of FIG. 4 after formation of an SIT spacer.
Figure 6:
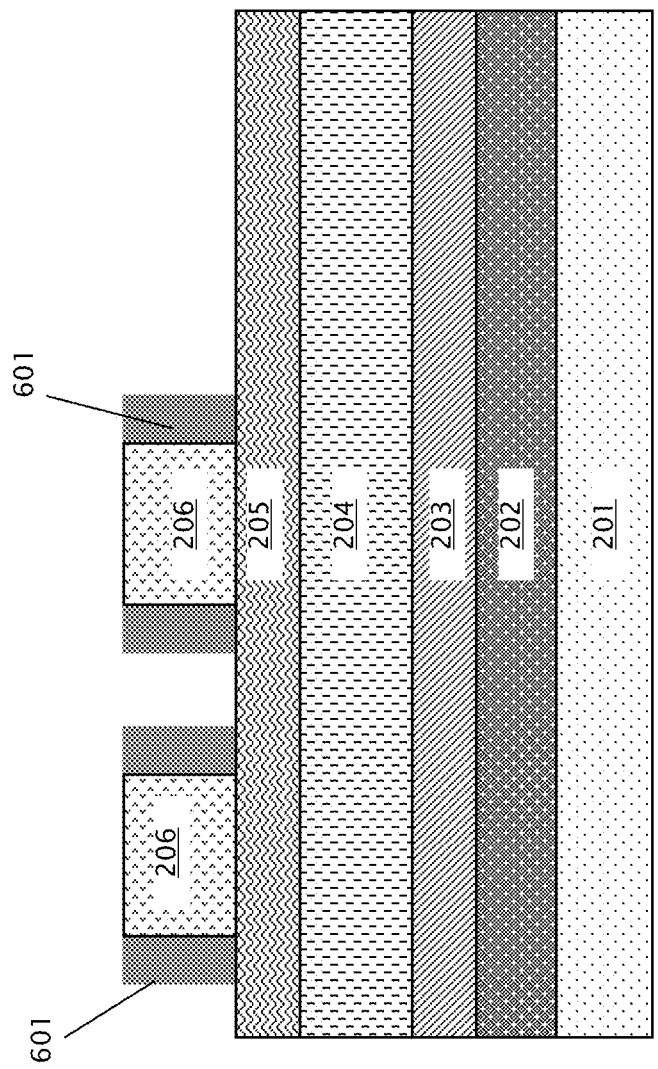
FIG. 6 is a cross sectional view illustrating an embodiment of the device of FIG. 5 after etchback of the SIT spacer.
Figure 7:
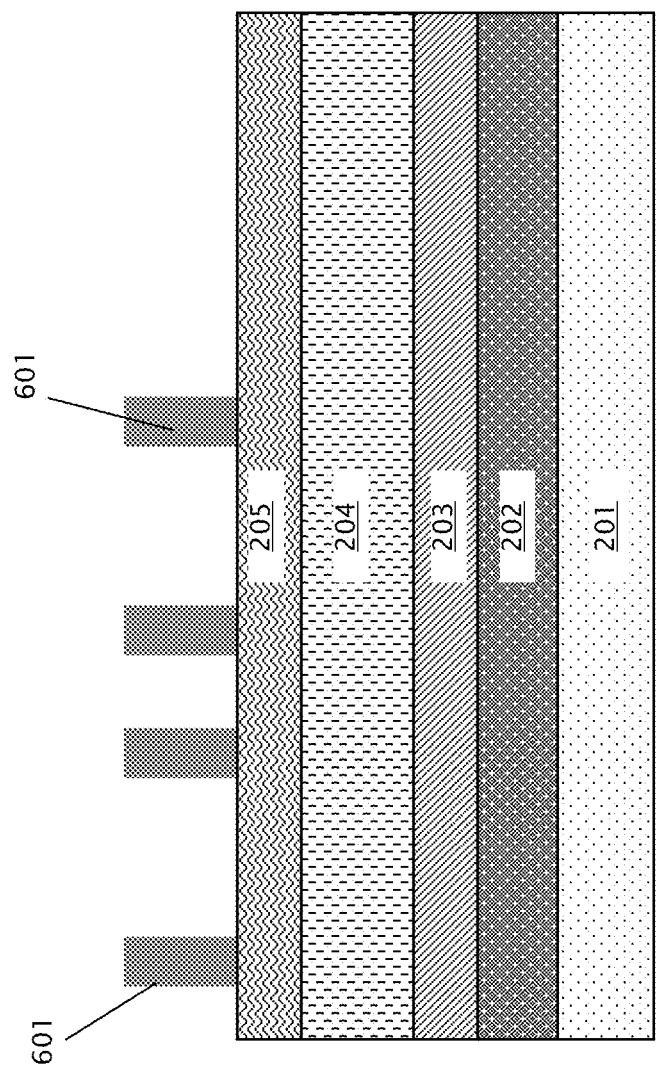
FIG. 7 is a cross sectional view illustrating an embodiment of the device of FIG. 6 after mandrel pull.

Turning to FIG. 1, a flowchart of an embodiment of a method 100 for FinFET formation using SIT and a film stack including a metal hardmask layer is provided. Method 100 of FIG. 1 is discussed with respect to FIGS. 2-18. In block 101 of method 100, a mandrel mask is formed on a metal hardmask layer that is part of a film stack. An embodiment of a process flow for mandrel mask formation as is performed in block 101 is illustrated with respect to FIGS. 2-7. FIG. 2 shows an embodiment of a film stack including a buried oxide (BOX) layer 201, a silicon on insulator (SOI) layer 202, a thermal oxide layer 203, an amorphous carbon layer 204, and the metal hardmask layer 205. The metal hardmask layer 205 may comprise titanium nitride (TiN) in some embodiments. The amorphous carbon layer 204 acts as a buffer layer to that aids in protecting the integrity of the thermal silicon oxide layer 203. Photoresist 208, organic planarization layer (OPL) 206, and silicon antireflective coating (SiARC) 207 corresponding to a mandrel mask are located on top of the film stack. The SiARC layer 207 and the OPL 206 are then etched using the patterned photoresist layer 208 as a mask, and the photoresist 208 is removed, as shown in FIG. 3. Then, the etched SiARC 207 is removed, as shown in FIG. 4, leaving the etched OPL 206. The etched OPL 206 comprises the mandrels which are used for SIT. A SIT spacer layer 501 is then deposited by conformal deposition over the etched OPL 206, as shown in FIG. 5. The SIT spacer layer 501 may comprise a nitride such as silicon nitride or an oxide such as silicon oxide in various embodiments, and may be deposited by conformal deposition. Etchback of SIT spacer layer 501 is then performed, resulting in sidewall spacers 601 as shown in FIG. 6 located on either side of the mandrels comprising the etched OPL 206. The etchback of SIT spacer layer 501 may comprise an anisotropic fluorine containing plasma etch, for example. Lastly, as shown in FIG. 7, the mandrels comprising the etched OPL 206 are pulled (i.e., removed), leaving the sidewall spacers 601, which comprise the mandrel mask, located on the metal hardmask layer 205. The mandrel pull may include an oxygen plasma etch in some embodiments.

Figure 8:
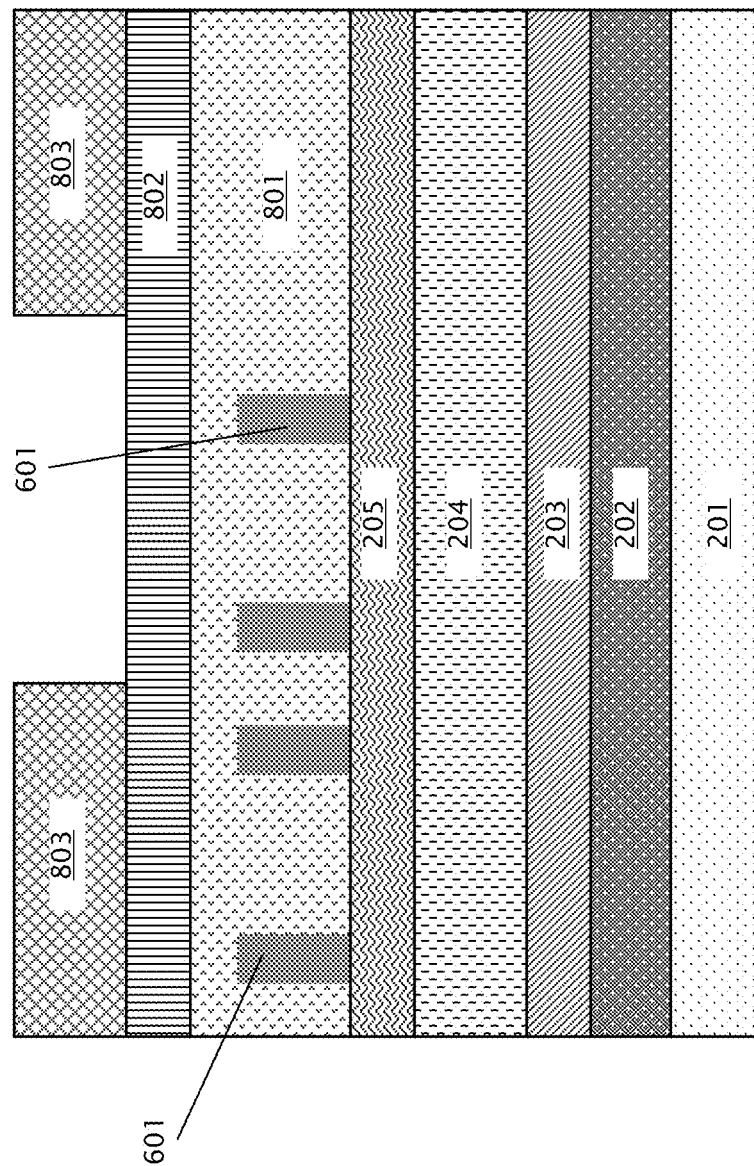
FIG. 8 is a cross sectional view illustrating an embodiment of the device of FIG. 7 after deposition of OPL, SiARC, and photoresist corresponding to a cut mask.
Figure 9:
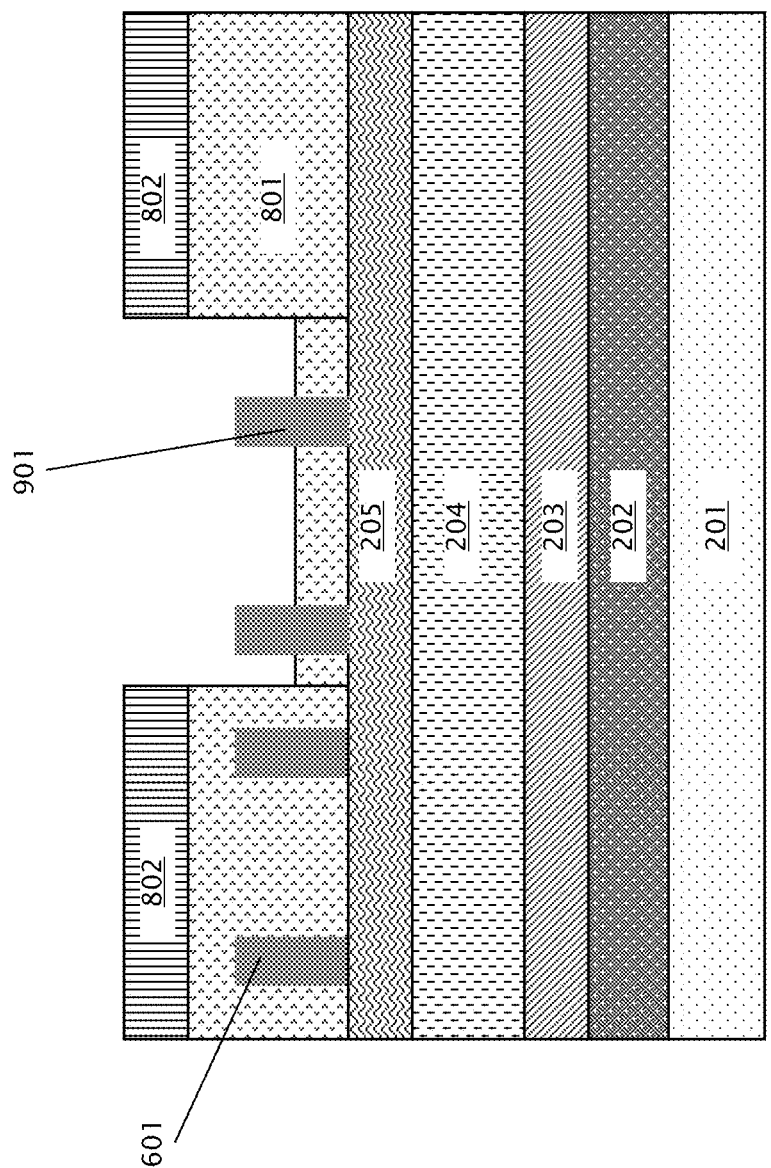
FIG. 9 is a cross sectional view illustrating an embodiment of the device of FIG. 8 after etching the OPL and SiARC, and removing the photoresist.
Figure 10:
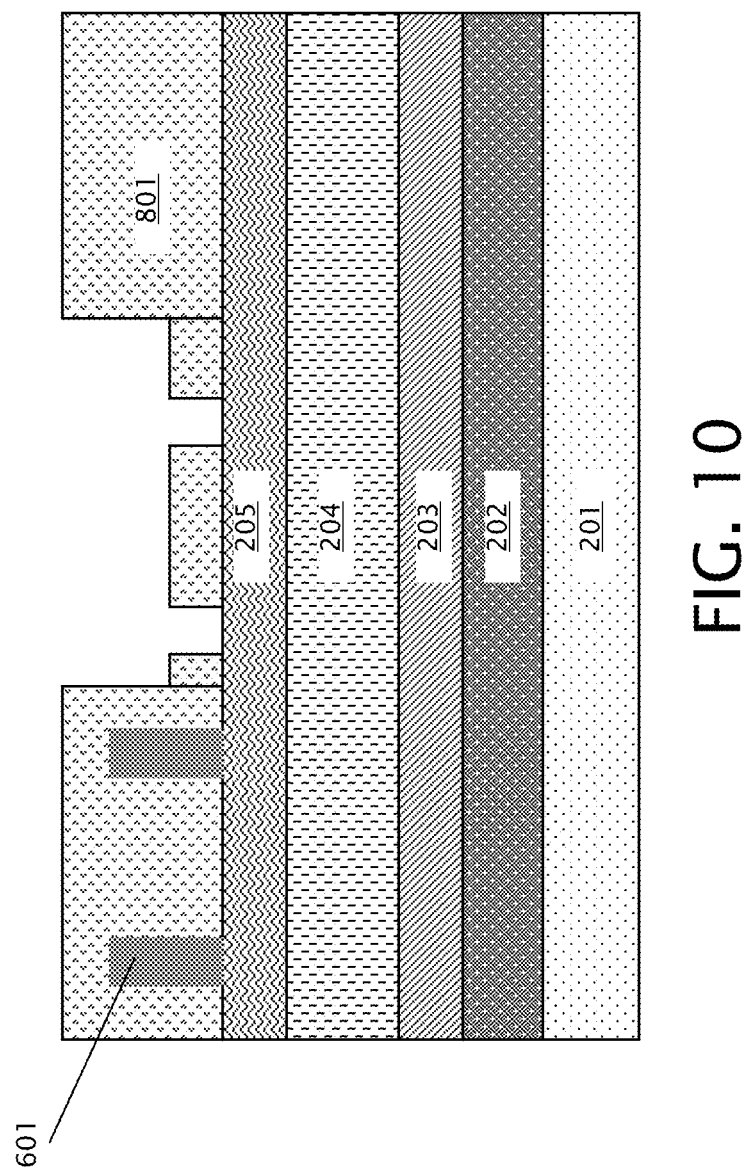
FIG. 10 is a cross sectional view illustrating an embodiment of the device of FIG. 9 after removal of unnecessary features and removal of the SiARC.
Figure 11:
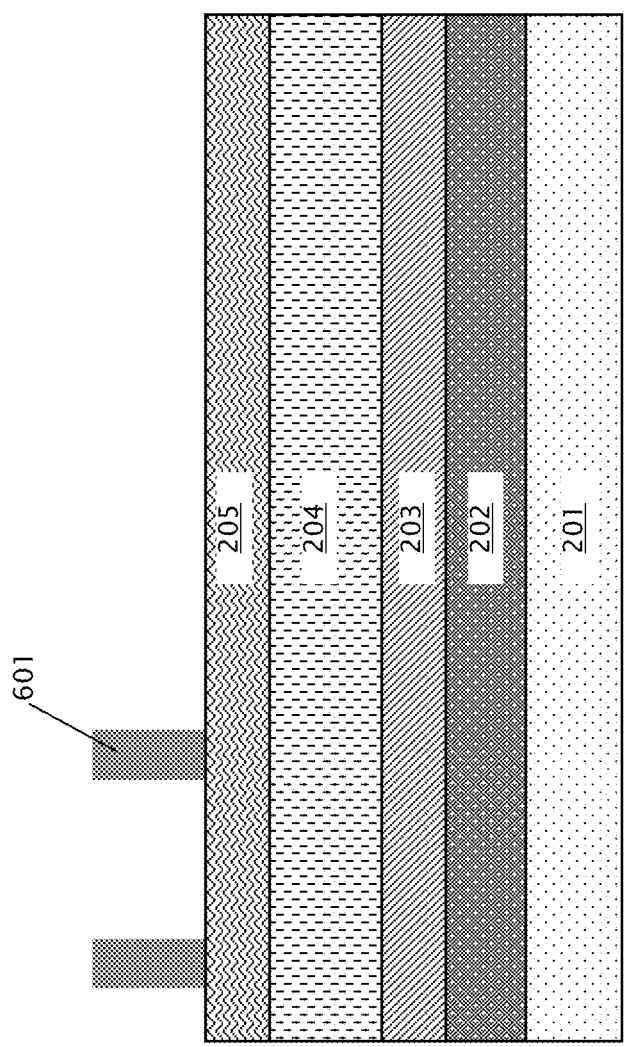
FIG. 11 is a cross sectional view illustrating an embodiment of the device of FIG. 10 after removal of the OPL.

Turning again to method 100 of FIG. 1, a cut mask is then formed on the metal hardmask layer in block 102. The cut mask functions to remove unnecessary features that were formed during mandrel mask formation in block 101. An embodiment of a process flow for cut mask formation as is performed in block 102 is illustrated with respect to FIGS. 8-11. First, as shown in FIG. 8, OPL 801, SiARC 802, and photoresist 803 are deposited over sidewall spacers 601 and metal hardmask layer 205. Then, as shown in FIG. 9, the OPL 801 and SiARC 802 are etched to expose the unnecessary sidewall spacers, such as sidewall spacer 901, that are to be removed by the cut mask. The SiARC etch may include a fluorocarbon etch in some embodiments. The OPL etch may contain an oxygen-containing plasma, such as $O_2$, $CO_2/CO$, $CO_2/N_2$, or a non-oxygen containing plasma, such as $H_2/N_2$ mixture. The patterned photoresist 803 acts as the masking layer for SiARC 802 etch, and may be removed during the etch of OPL 801. The OPL 802 etch could be a full OPL etch or a partial OPL etch. The exposed sidewall spacers, such as sidewall spacer 901, are then removed, as shown in FIG. 10. This may be performed using fluorocarbon chemistry based etch, for example. The remaining SiARC layer 802 may also be removed during the removal of the exposed sidewall spacers 601. Lastly, as shown in FIG. 11, the remaining OPL 801 is removed. Remaining sidewall spacers 601, which comprise the mandrel mask and the cut mask, are left on metal hardmask layer 205 at the end of block 102 of method 100.

Figure 12:
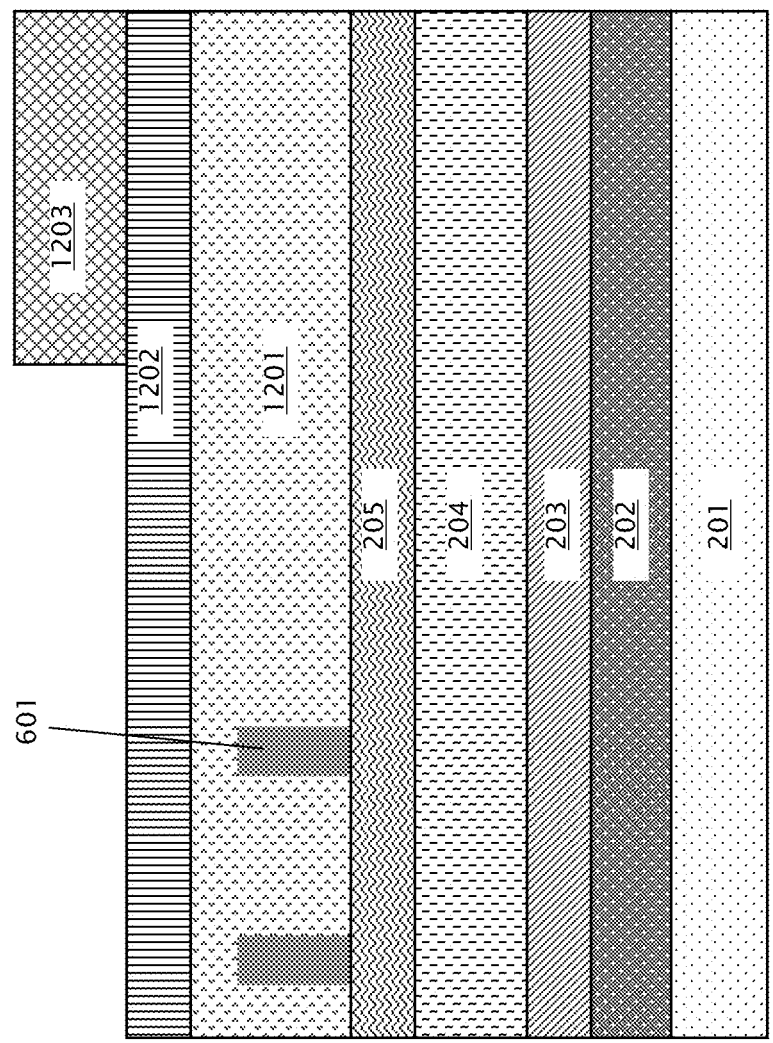
FIG. 12 is a cross sectional view illustrating an embodiment of the device of FIG. 11 after deposition of OPL, SiARC, and photoresist corresponding to a large feature (FX) mask.
Figure 13:
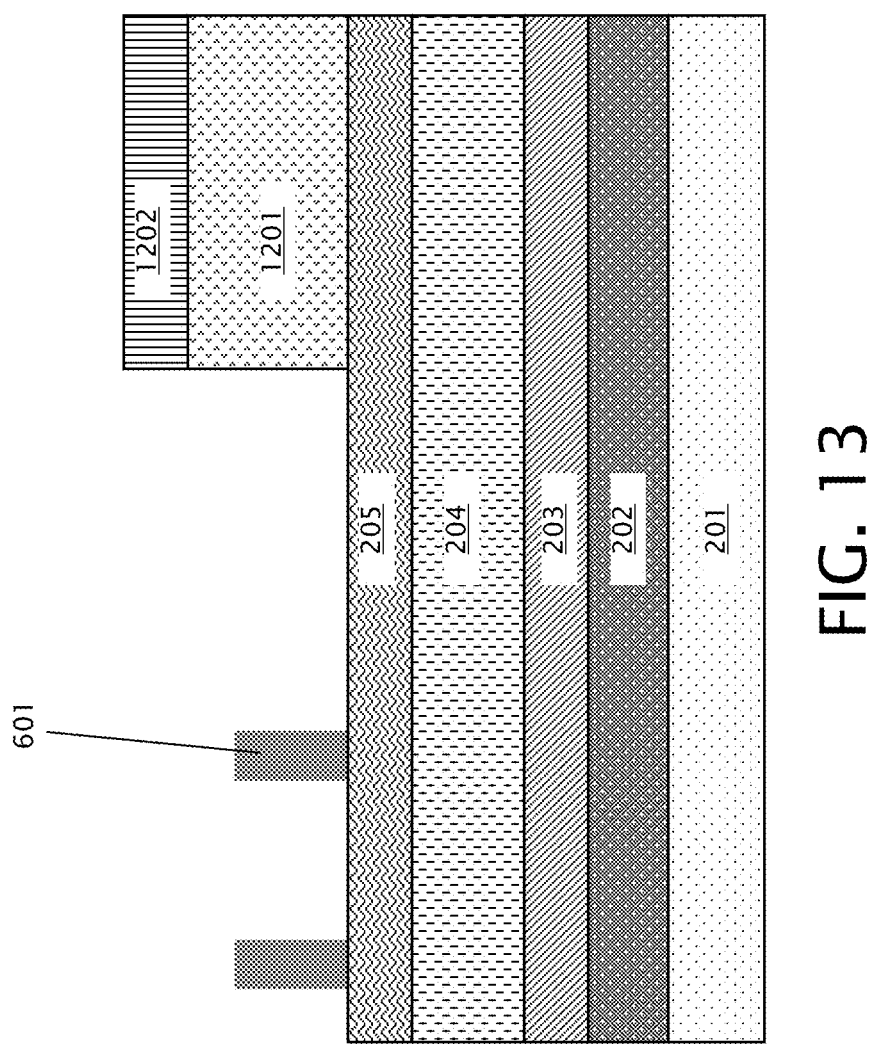
FIG. 13 is a cross sectional view illustrating an embodiment of the device of FIG. 12 after etching of the OPL and SiARC and removal of the photoresist.

Referring again to method 100 of FIG. 1, a FX mask is then formed on the metal hardmask layer in block 103. An embodiment of a process flow for FX mask formation as is performed in block 103 is illustrated with respect to FIGS. 12-13. First, as shown in FIG. 12, OPL 1201, SiARC 1202, and photoresist 1203 are deposited over sidewall spacers 601 and metal hardmask layer 205. Then, as shown in FIG. 13, the OPL 1201 and SiARC 1202 are etched to form the FX mask. The etch of OPL 1201 is selected such that the sidewall spacers 601 are not removed by the etch of OPL 1201. The patterned photoresist 1203 may be removed during the etch of OPL 1201.

Figure 14:
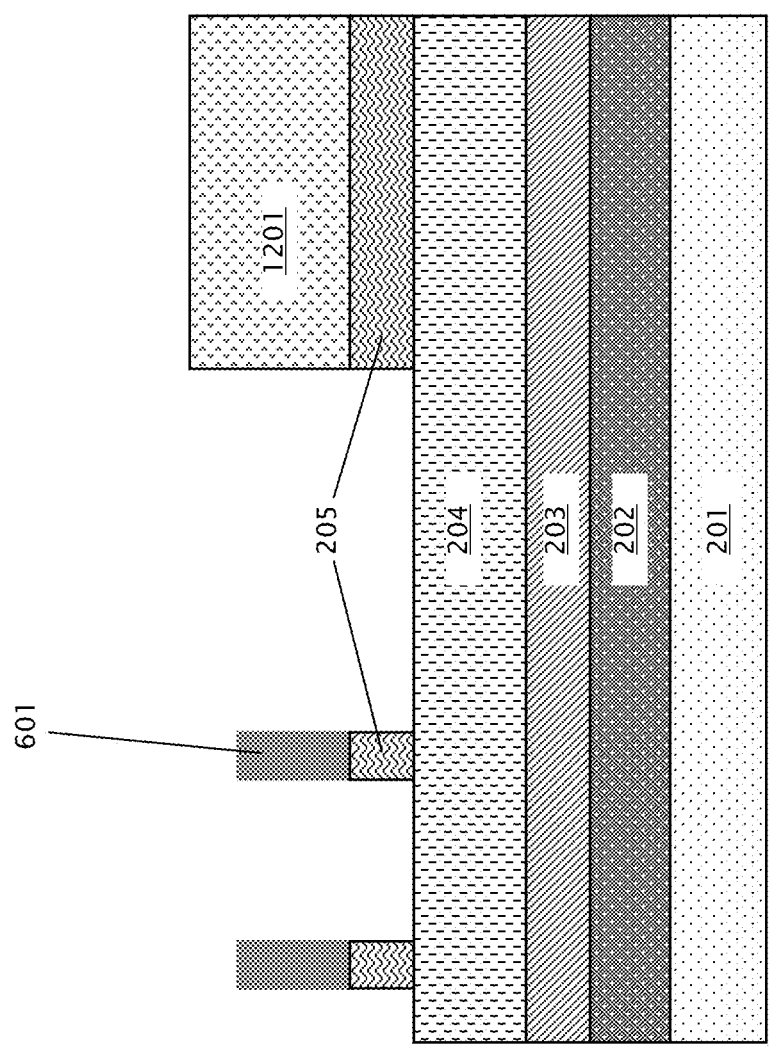
FIG. 14 is a cross sectional view illustrating an embodiment of the device of FIG. 13 after etching of the mandrel, cut, and FX masks into the metal hardmask layer.

Method 100 of FIG. 1 then proceeds to block 104, in which the mandrel, cut, and FX masks are etched into the metal hardmask layer, resulting in an etched metal hardmask layer. An embodiment of an etched metal hardmask layer 205 is shown in FIG. 14. SiARC layer 1202 may be removed during etching of metal hardmask layer 205, or may be separately removed afterwards in various embodiments. The sidewall spacers 601 are also partially removed during etching of metal hardmask layer 205, and may be fully removed afterwards.

Figure 15:
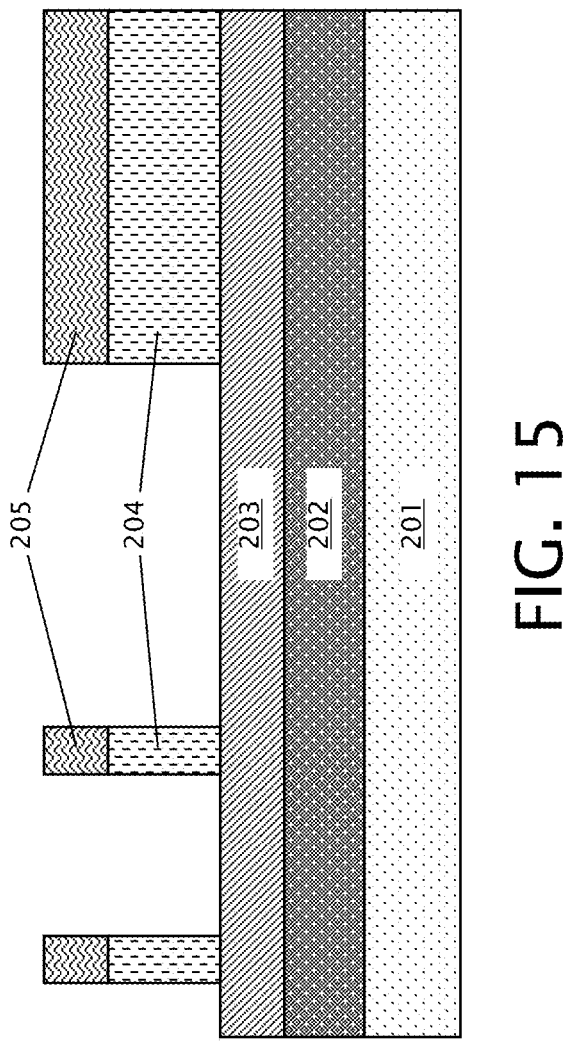
FIG. 15 is a cross sectional view illustrating an embodiment of the device of FIG. 14 after etching of the amorphous carbon layer.
Figure 16:
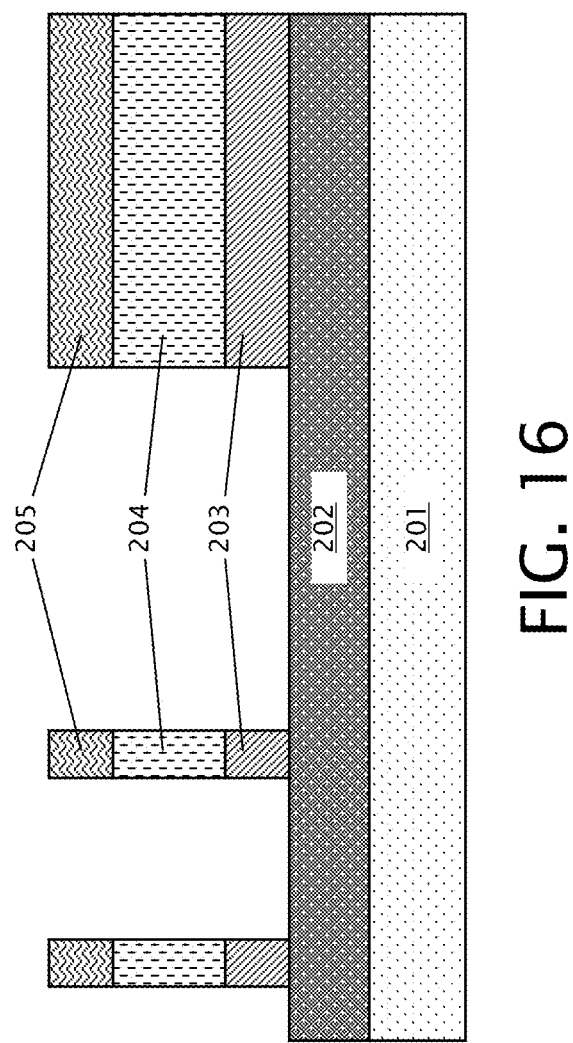
FIG. 16 is a cross sectional view illustrating an embodiment of the device of FIG. 15 after etching of the thermal silicon oxide layer.
Figure 17:
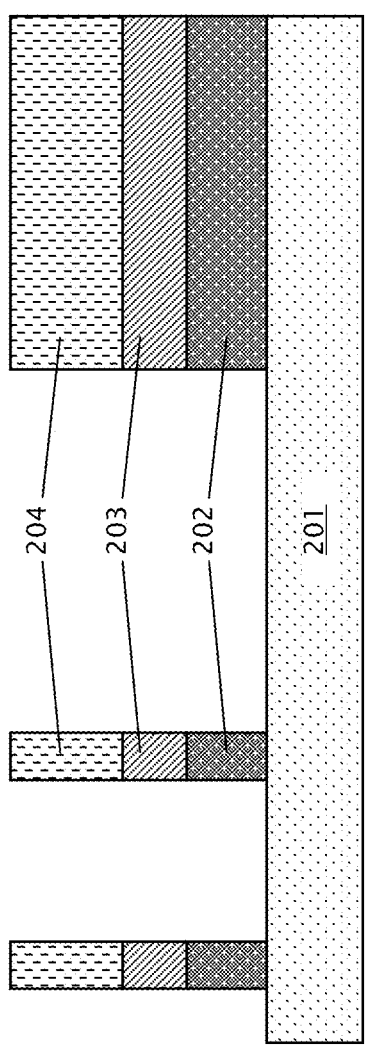
FIG. 17 is a cross sectional view illustrating an embodiment of the device of FIG. 16 after etching of the mandrel, cut, and FX masks into the SOI layer.
Figure 18:
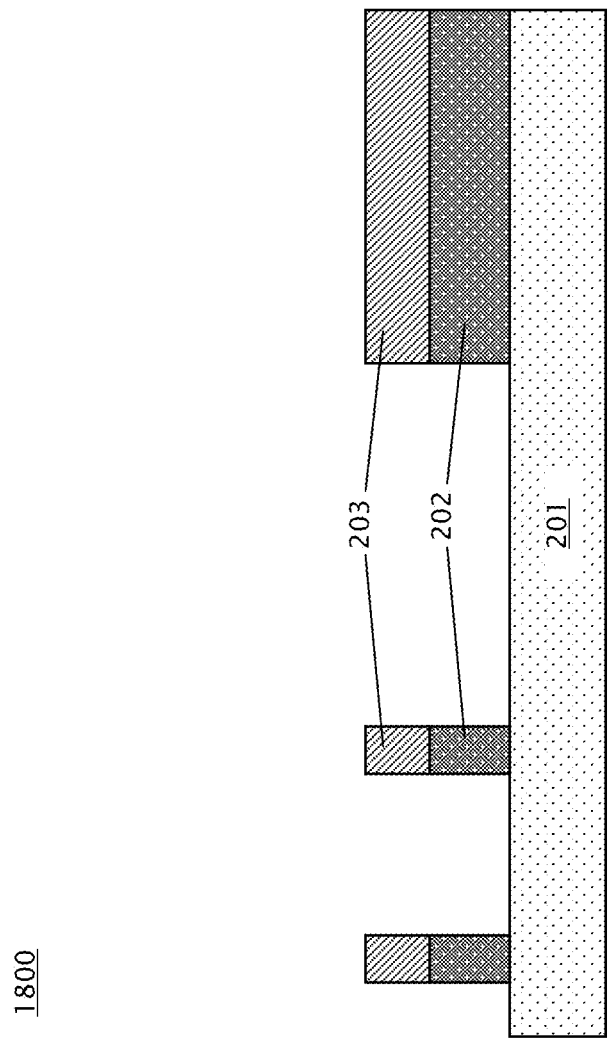
FIG. 18 is a cross sectional view illustrating an embodiment of the device of FIG. 17 after removal of the remaining amorphous carbon layer.

After the various masks are etched into the metal hardmask layer to form the etched metal hardmask layer, then, referring again to method 100 of FIG. 1, the etched metal hardmask layer is used as a mask to etch the mandrel, cut, and FX masks into the SOI layer in block 105. An embodiment of a process flow for mask transfer into the SOI as is performed in block 105 is illustrated with respect to FIGS. 15-18. First, as shown in FIG. 15, the amorphous carbon layer 204 is etched using the etched metal hardmask layer 205 as a mask. Then, as shown in FIG. 16, the thermal oxide layer 203 is etched using the etched metal hardmask layer 205 as a mask. Then, as shown in FIG. 17, the mandrel, cut, and FX masks are etched into SOI layer 202. The etched metal hardmask layer 205 may be removed during the etching of SOI layer 202. Finally, as shown in FIG. 18, any remaining portion of amorphous carbon layer 204 is removed, leaving device 1800, which includes a thermal oxide layer 203 and SOI layer 202 into which mandrel, cut, and FX masks have been etched. Simultaneous etching of the various masks into the SOI layer 202 maintains the integrity of the thermal oxide layer 203, allowing formation of FinFETs with relatively low thermal oxide thickness variation on device 1800.

Figure 19:
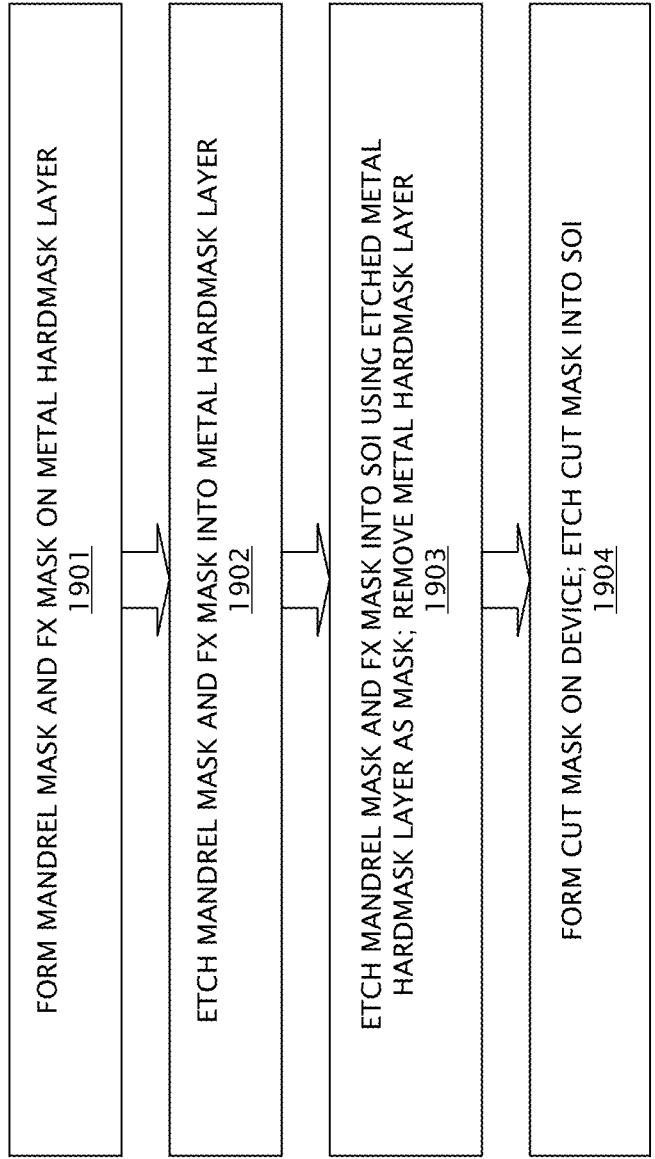
FIG. 19 illustrates a flowchart of another embodiment of a method for FinFET formation using SIT and a film stack including a metal hardmask layer.

FIG. 19 shows a flowchart of another embodiment of a method 1900 for FinFET formation using SIT and a metal hardmask layer in which the mandrel mask and the FX mask are transferred into the metal hardmask layer and then into the SOI, and the cut mask is applied afterwards. A first embodiment of a process flow for method 1900 of FIG. 19, that does not include stitching, is discussed with respect to FIGS. 2-5 and 20-33. A second embodiment of a process flow for method 1900 of FIG. 19, that includes stitching, is discussed subsequently with respect to FIGS. 2-5 and 34-48. In devices that have a particular layer that requires large features that are defined lithographically to overlap with fine features that are defined by advanced patterning, stitching is required to meet integration requirements.

Figure 20:
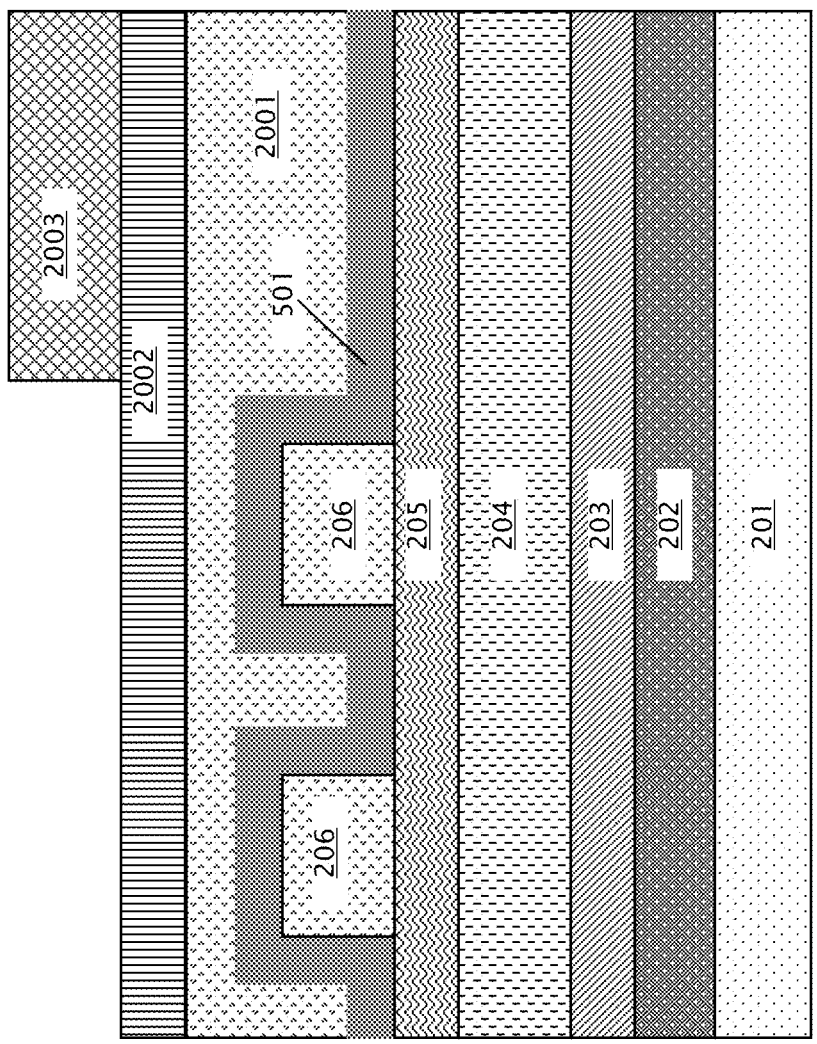
FIG. 20 is a cross sectional view illustrating an embodiment of the device of FIG. 5 after deposition of OPL, SiARC, and photoresist corresponding to a large feature (FX) mask without stitching.
Figure 21:
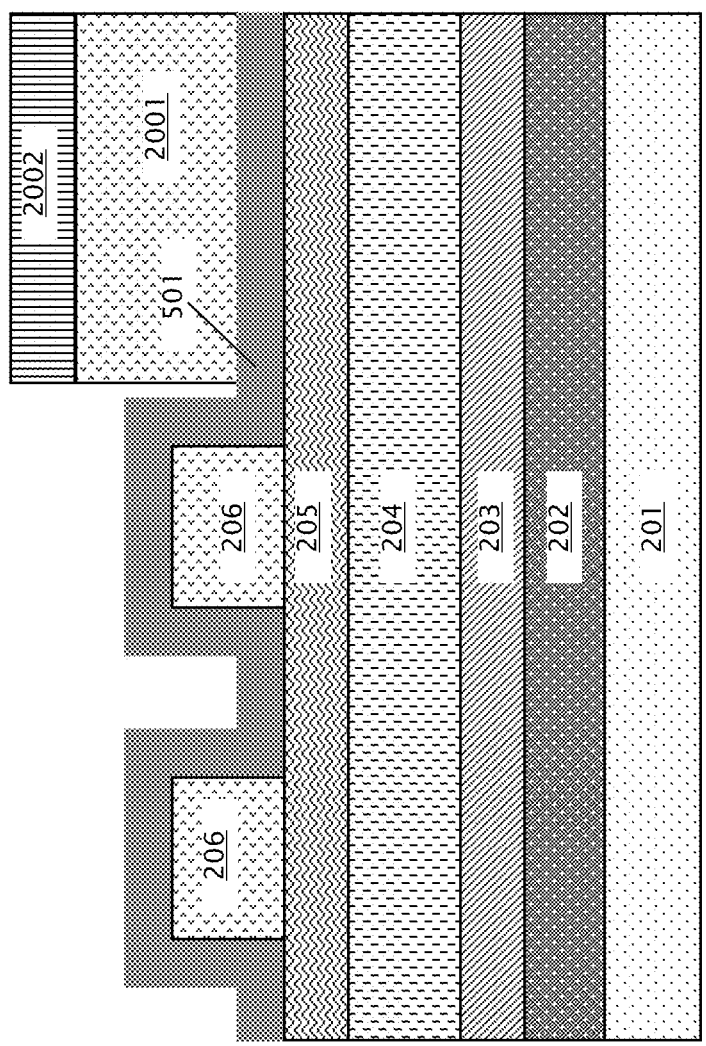
FIG. 21 is a cross sectional view illustrating an embodiment of the device of FIG. 20 after etching of the OPL and SiARC and removal of the photoresist.
Figure 22:
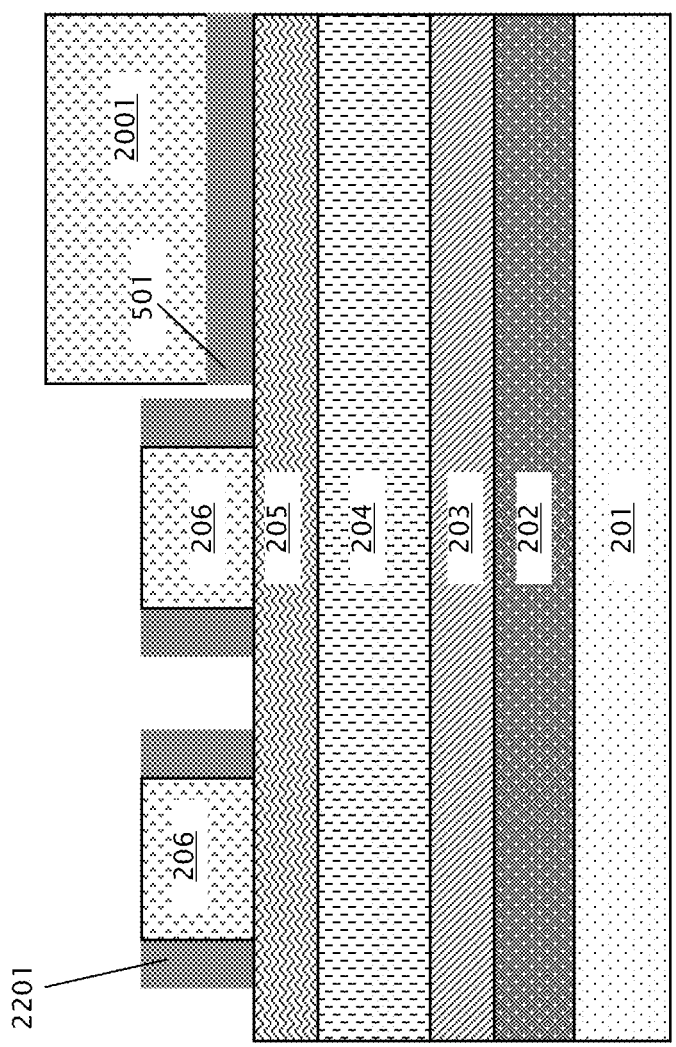
FIG. 22 is a cross sectional view illustrating an embodiment of the device of FIG. 21 after etchback of the SIT spacer.
Figure 23:
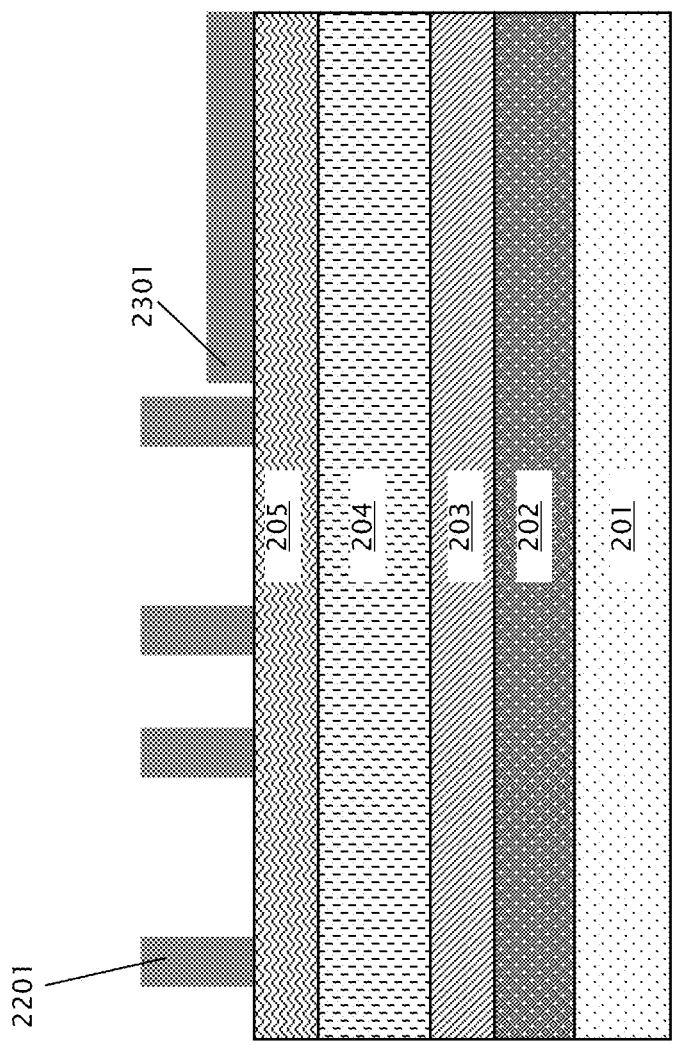
FIG. 23 is a cross sectional view illustrating an embodiment of the device of FIG. 22 after removal of the OPL.

Turning to the first embodiment of the process flow for method 1900, in block 1901, a mandrel mask and an FX mask are formed on a metal hardmask layer that is part of a film stack. An embodiment of a process flow for mandrel and FX mask formation as is performed in the first embodiment of block 1901 is illustrated with respect to FIGS. 2-5 and 20-23. FIG. 2 shows an embodiment of a film stack including a buried oxide (BOX) layer 201, a silicon on insulator (SOI) layer 202, a thermal oxide layer 203, an amorphous carbon layer 204, and the metal hardmask layer 205. The metal hardmask layer 205 may comprise titanium nitride (TiN) in some embodiments. Photoresist 208, organic planarization layer (OPL) 206, and silicon antireflective coating (SiARC) 207 corresponding to a mandrel mask are located on top of the film stack. The SiARC layer 207 and the OPL 206 are then etched using the photoresist layer 208 as a mask, and the photoresist 208 is removed, as shown in FIG. 3. Then, the etched SiARC 207 is removed, as shown in FIG. 4, leaving the etched OPL 206. The etched OPL 206 comprises the mandrels which are used for SIT. A SIT spacer layer 501 is then deposited by conformal deposition over the etched OPL 206, as shown in FIG. 5. The SIT spacer layer 501 may comprise a nitride such as silicon nitride or an oxide such as silicon oxide in various embodiments. Then, proceeding to FIG. 20, OPL 2001, SiARC 2002, and photoresist 2003 corresponding to the FX mask are formed over the SIT spacer layer 501. In the embodiment without stitching, the patterned photoresist 2003 does not overlap with the mandrels comprising etched OPL 206, as shown in FIG. 20. The OPL 2001 and SiARC are then etched using the patterned photoresist 2003 as a mask, as shown in FIG. 21; photoresist 2003 is removed during the etch of OPL 2001. Etchback of SIT spacer layer 501 is then performed, resulting in sidewall spacers 2201 as shown in FIG. 22; the etchback of SIT spacer layer 501 may comprise an anisotropic fluorocarbon etch. SiARC 2002 may be removed during etchback of SIT spacer layer 501. The OPL 206 and 2001 are then removed as shown in FIG. 23, leaving sidewall spacers 2201 (which comprise the mandrel mask) and FX mask 2301 located on metal hardmask layer 205.

Figure 24:
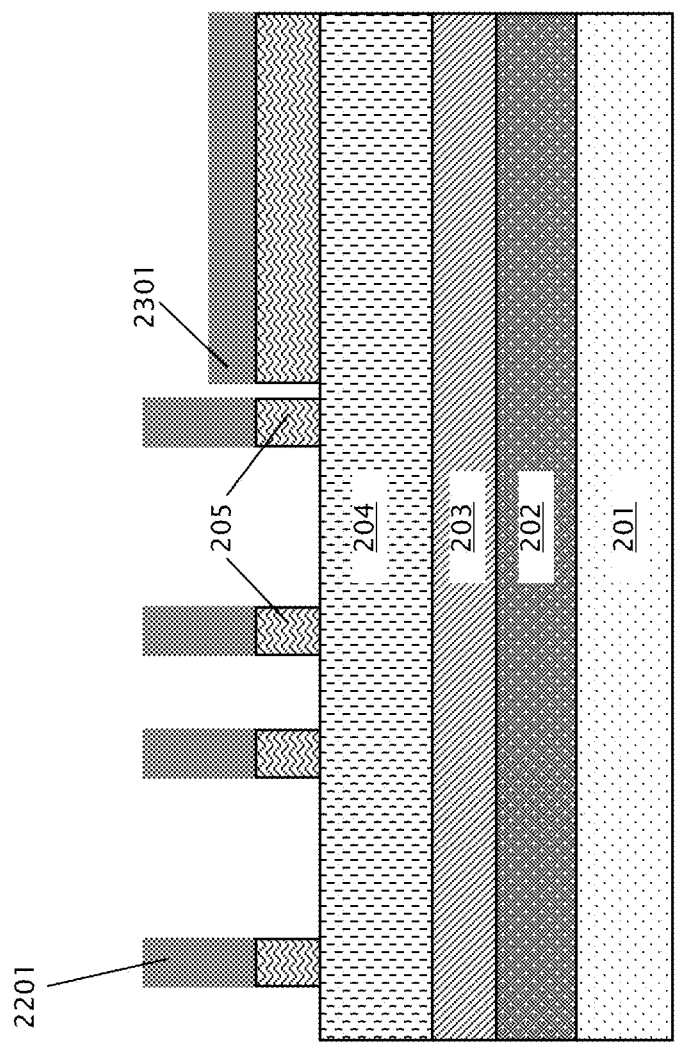
FIG. 24 is a cross sectional view illustrating an embodiment of the device of FIG. 23 after etching the mandrel and FX masks into the metal hardmask layer.
Figure 25:
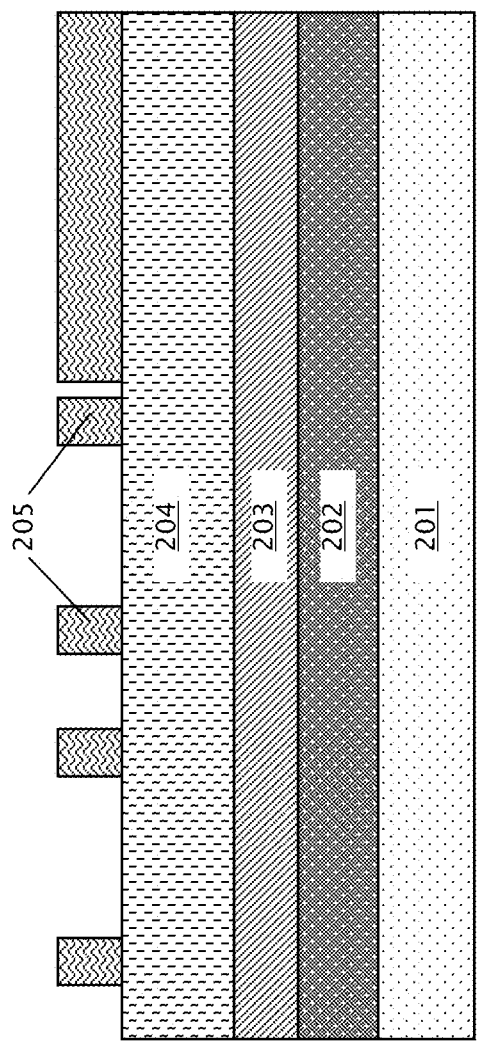
FIG. 25 is a cross sectional view illustrating an embodiment of the device of FIG. 24 after removal of the remaining SIT spacer.

Method 1900 of FIG. 19 then proceeds to block 1902, in which the mandrel mask and FX mask are etched into the metal hardmask layer. As shown in FIG. 24, metal hardmask layer 205 is etched using sidewall spacers 2201 and FX mask 2301 as a mask to form etched metal hardmask layer 205 as shown in FIG. 24. The sidewall spacers 2201 and the FX mask 2301 are then removed from etched metal hardmask layer 205 as shown in FIG. 25; the removal may comprise oxide wet removal in some embodiments, or plasma dry removal in other embodiments.

Figure 26:
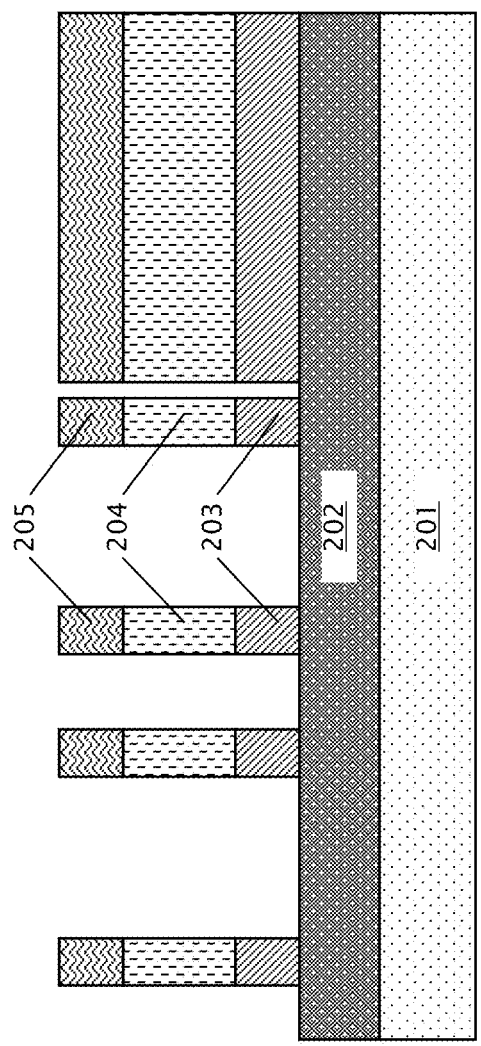
FIG. 26 is a cross sectional view illustrating an embodiment of the device of FIG. 25 after etching of the amorphous carbon layer and the thermal silicon oxide layer.
Figure 27:
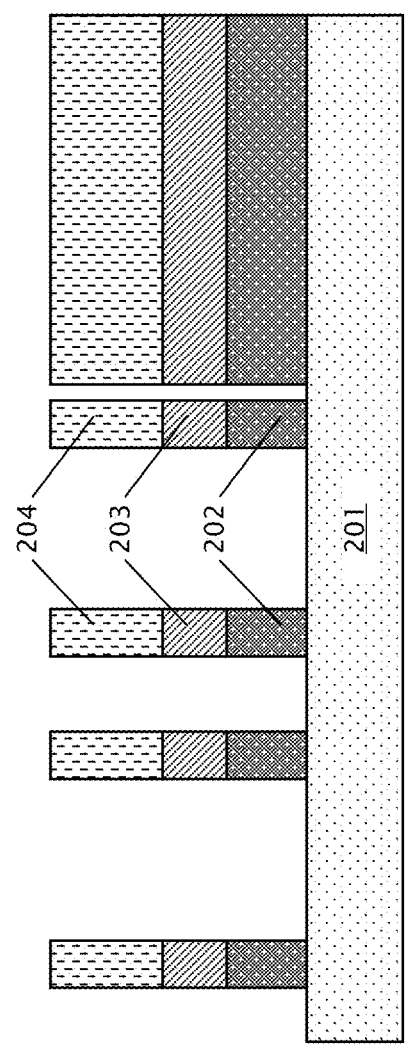
FIG. 27 is a cross sectional view illustrating an embodiment of the device of FIG. 26 after etching the mandrel and FX masks into the SOI layer.
Figure 28:
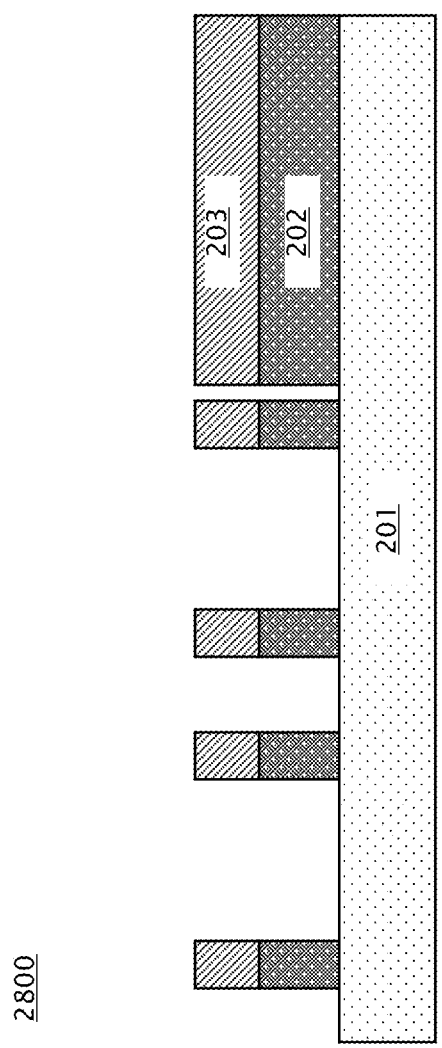
FIG. 28 is a cross sectional view illustrating an embodiment of the device of FIG. 27 after removing the remaining amorphous carbon layer.

After the mandrel and FX masks are etched into the metal hardmask layer, then, referring again to method 1900 of FIG. 19, the etched metal hardmask layer is used to etch the mandrel and FX masks into the SOI layer in block 1903. An embodiment of a process flow for mask transfer into the SOI as is performed in block 1903 is illustrated with respect to FIGS. 26-28. First, as shown in FIG. 26, the amorphous carbon layer 204 and the thermal oxide layer 203 are etched using the etched metal hardmask layer 205 as a mask. Then, as shown in FIG. 27, the SOI layer 202 is etched. The etched metal hardmask layer 205 may be removed during the etching of SOI layer 202. Finally, as shown in FIG. 28, the remaining portion of amorphous carbon layer 204 is removed, leaving device 2800, which includes thermal oxide layer 203 and SOI layer 202 into which mandrel and FX masks have been simultaneously etched. Simultaneous etching of the various masks into the SOI 202 maintains the integrity of the thermal oxide layer 203.

Figure 29:
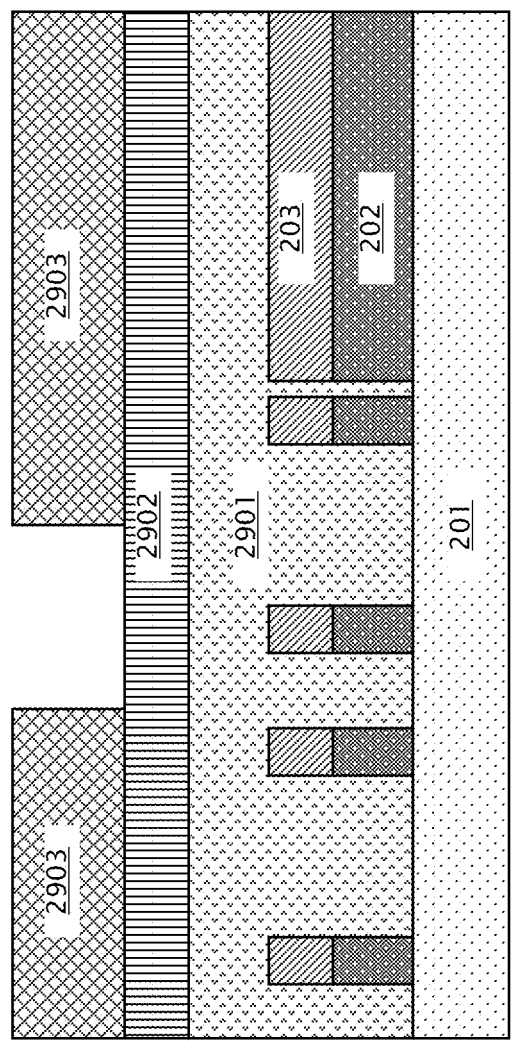
FIG. 29 is a cross sectional view illustrating an embodiment of the device of FIG. 28 after deposition of OPL, SiARC, and photoresist corresponding to a cut mask.
Figure 30:
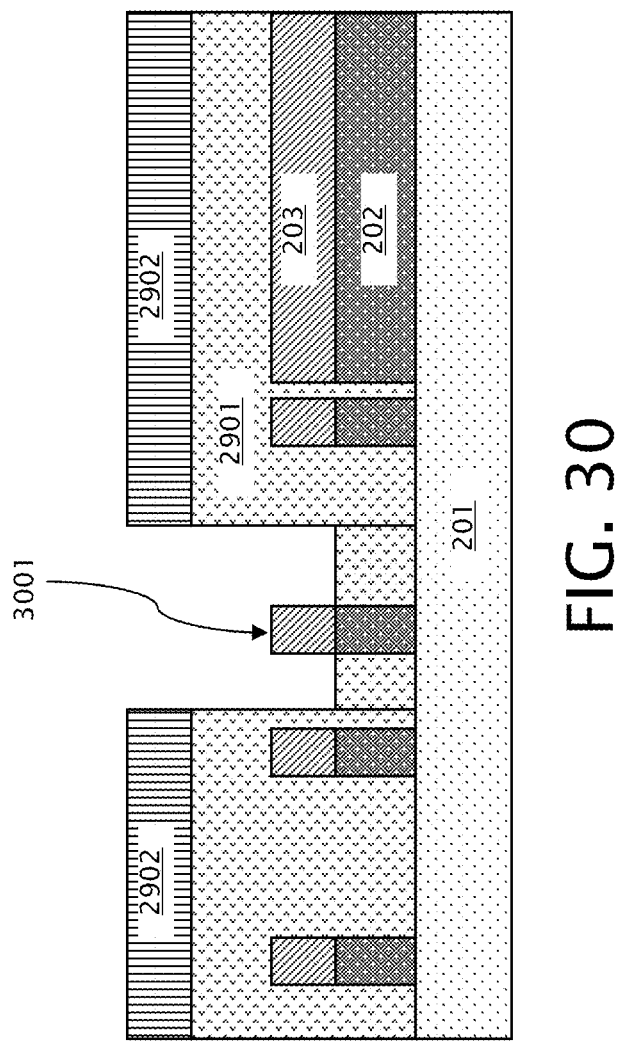
FIG. 30 is a cross sectional view illustrating an embodiment of the device of FIG. 29 after etching of the SiARC and the OPL, and removal of the photoresist.
Figure 31:
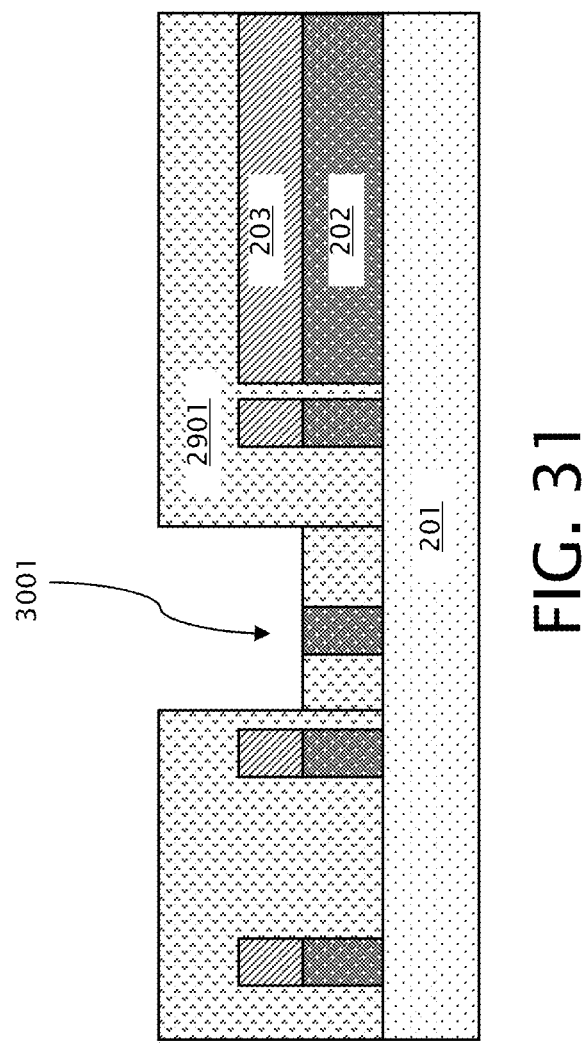
FIG. 31 is a cross sectional view illustrating an embodiment of the device of FIG. 30 after removal of a thermal silicon oxide portion of an unnecessary feature.
Figure 32:
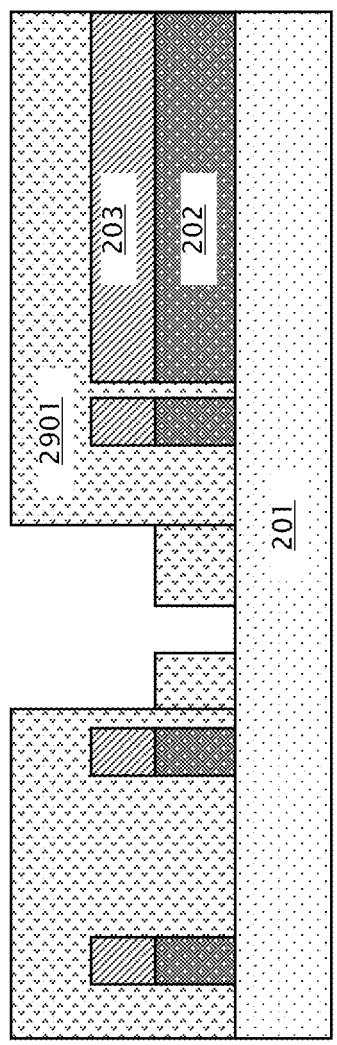
FIG. 32 is a cross sectional view illustrating an embodiment of the device of FIG. 31 after removal of a SOI portion of the unnecessary feature.
Figure 33:
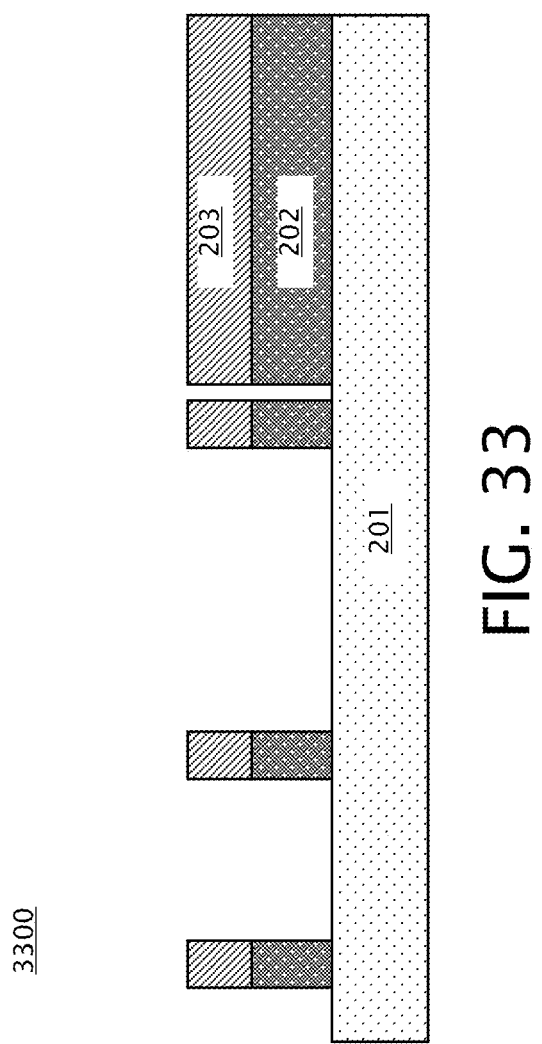
FIG. 33 is a cross sectional view illustrating an embodiment of the device of FIG. 32 after removal of the OPL.

Turning again to method 1900 of FIG. 19, in block 1904 a cut mask is formed to remove any unnecessary features that were formed by the mandrel and/or FX masks. An embodiment of a process flow for cut mask formation as is performed in block 1904 is illustrated with respect to FIGS. 29-33. First, as shown in FIG. 29, OPL 2901, SiARC 2902, and photoresist 2903 are deposited over the etched SOI 202 and thermal oxide layer 203. Then, as shown in FIG. 30, the OPL 2901 and SiARC 2902 are etched to expose any unnecessary features, such as feature 3001, in etched SOI 202 and etched thermal oxide layer 203. The SiARC etch may include a fluorocarbon etch in some embodiments. The OPL etch may contain an oxygen-containing plasma, such as $O_2$, $CO_2/CO$, $CO_2/N_2$, or a non-oxygen containing plasma, such as $H_2/N_2$ mixture. The patterned photoresist 2903 acts as the masking layer for SiARC 2902 etch, and may be removed during the etch of OPL 2901. The exposed features, such as feature 3001, are then removed, as shown in FIGS. 31-32. The top thermal oxide portion of the exposed features may be removed first (FIG. 31), and then the bottom SOI portion (FIG. 32). The SiARC layer 2902 may also be removed during the removal of the thermal oxide portion of the exposed features. Lastly, as shown in FIG. 33, the remaining OPL 2901 is removed, leaving device 3300, on which FinFETs having relatively low thermal oxide thickness variation may be formed.

Figure 34:
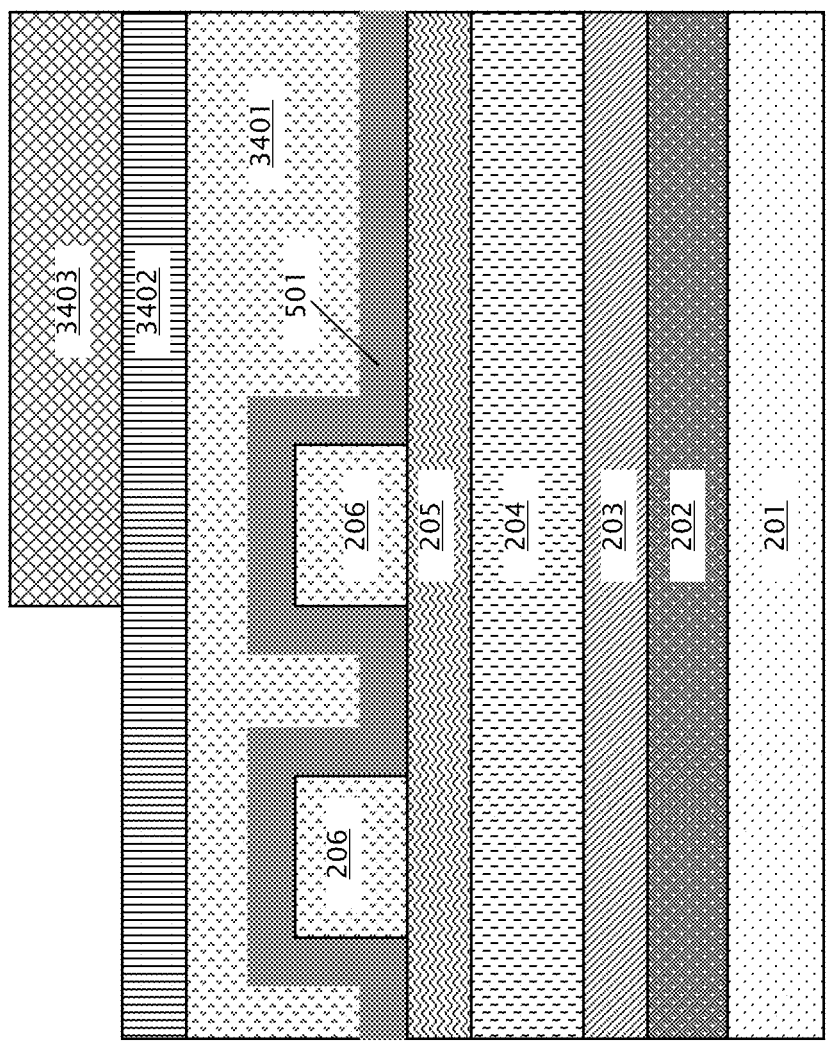
FIG. 34 is a cross sectional view illustrating an embodiment of the device of FIG. 5 after deposition of OPL, SiARC, and photoresist corresponding to a large feature (FX) mask with stitching.
Figure 35:
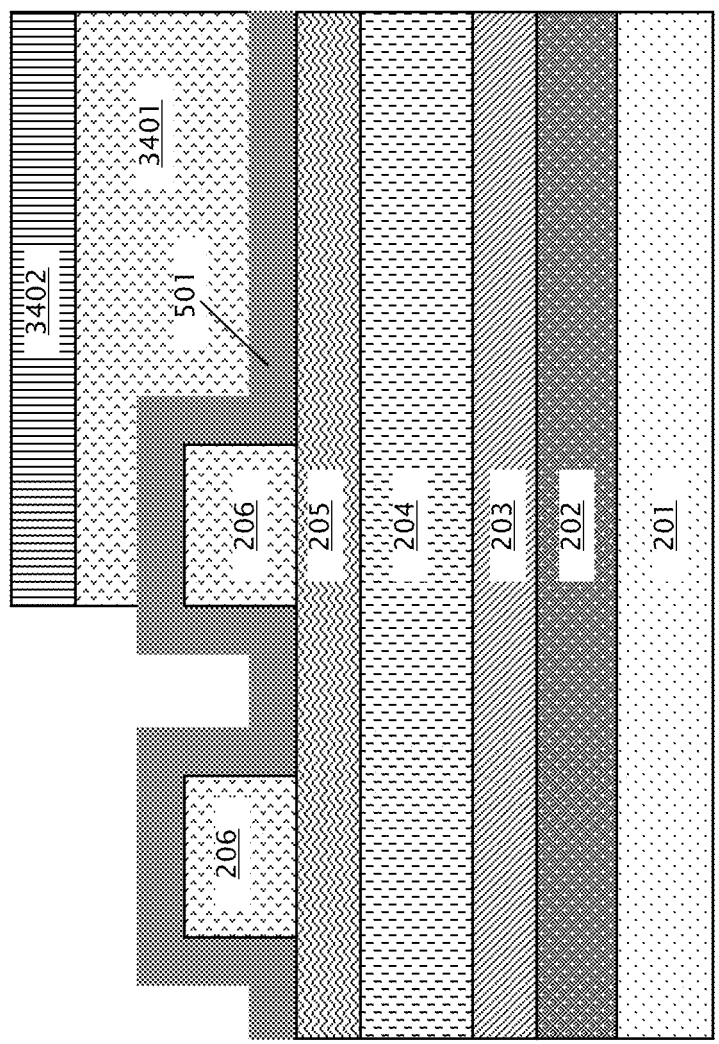
FIG. 35 is a cross sectional view illustrating an embodiment of the device of FIG. 34 after etching of the OPL and SiARC, and removal of the photoresist.
Figure 36:
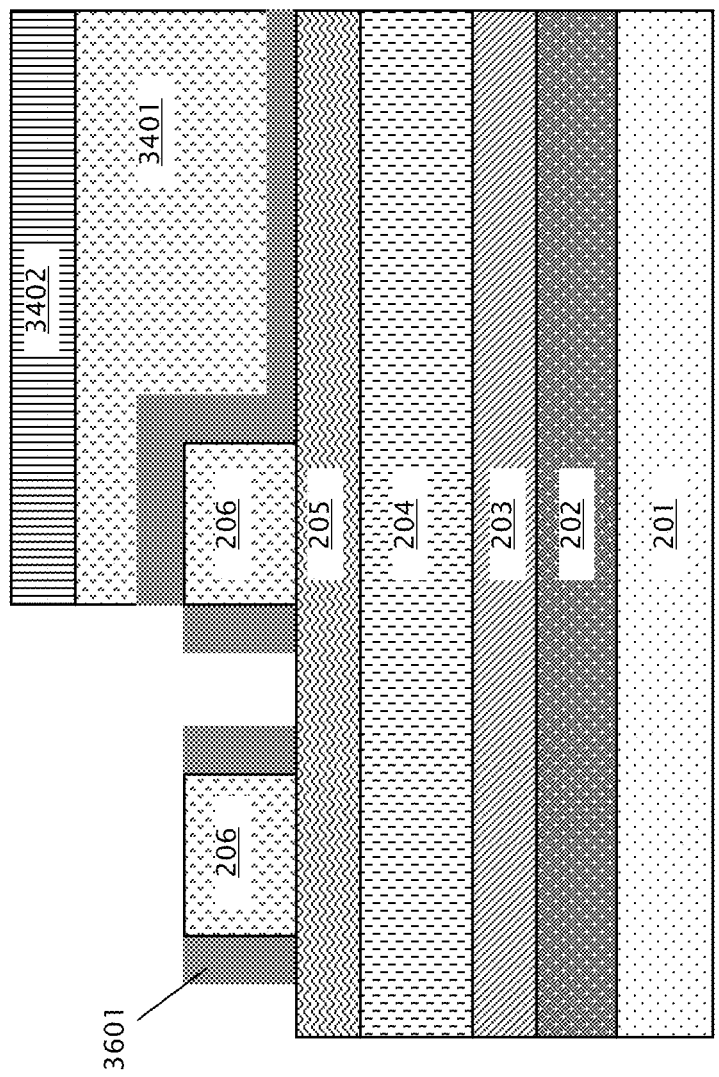
FIG. 36 is a cross sectional view illustrating an embodiment of the device of FIG. 35 after etchback of the SIT spacer.
Figure 37:
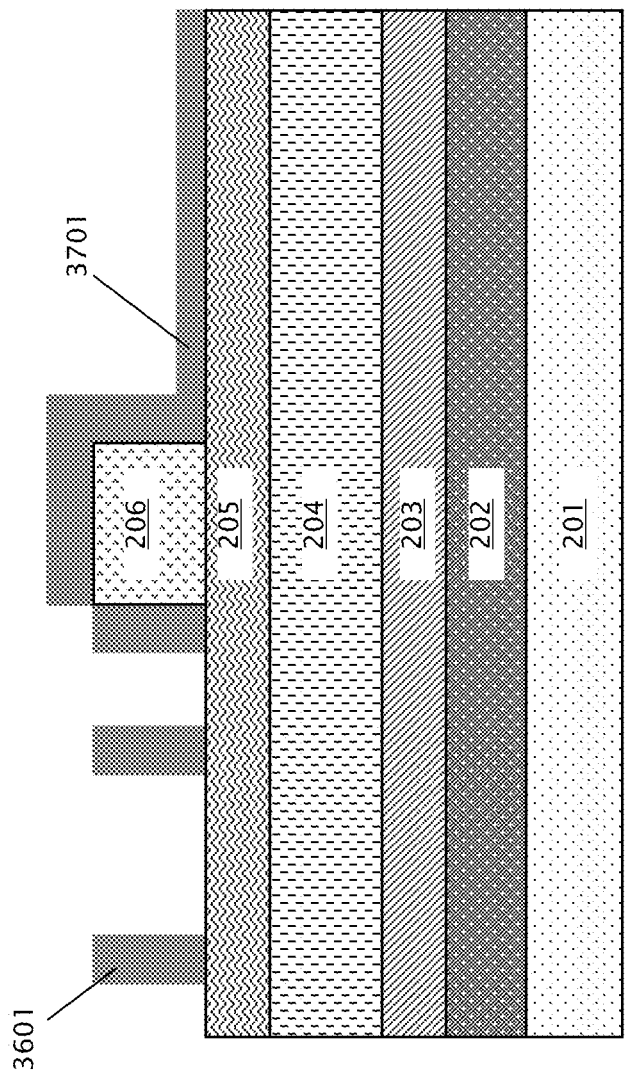
FIG. 37 is a cross sectional view illustrating an embodiment of the device of FIG. 36 after etching removal of the OPL that is not located under the SIT spacer.

The second embodiment of method 1900 of FIG. 19, that includes stitching, is now discussed with respect to FIGS. 2-5 and 34-48. Turning to the second embodiment, in block 1901 of method 1900, a mandrel mask and an FX mask are formed with stitching on a metal hardmask layer that is part of a film stack. An embodiment of a process flow for mandrel and FX mask formation as is performed in the second embodiment of block 1901 is illustrated with respect to FIGS. 2-5 and 34-37. FIG. 2 shows an embodiment of a film stack including a buried oxide (BOX) layer 201, a silicon on insulator (SOI) layer 202, a thermal oxide layer 203, an amorphous carbon layer 204, and the metal hardmask layer 205. The metal hardmask layer 205 may comprise titanium nitride (TiN) in some embodiments. Photoresist 208, organic planarization layer (OPL) 206, and silicon antireflective coating (SiARC) 207 corresponding to a mandrel mask are located on top of the film stack. The SiARC layer 207 and the OPL 206 are then etched using the photoresist layer 208 as a mask, and the photoresist 208 is removed, as shown in FIG. 3. Then, the etched SiARC 207 is removed, as shown in FIG. 4, leaving the etched OPL 206. The etched OPL 206 comprises the mandrels which are used for SIT. A SIT spacer layer 501 is then deposited by conformal deposition over the etched OPL 206, as shown in FIG. 5. The SIT spacer layer 501 may comprise a nitride such as silicon nitride or an oxide such as silicon oxide in various embodiments. Then, as shown in FIG. 34, OPL 3401, SiARC 3402, and photoresist 3403 corresponding to the FX mask are formed over the SIT spacer layer 501. In the embodiment with stitching, the photoresist 3403 overlaps with the mandrels comprising etched OPL 206, as shown in FIG. 34. The OPL 3401 and SiARC 3402 are then etched using the photoresist 3403 as a mask, as shown in FIG. 35; photoresist 3403 is removed during the etch of OPL 3401. Etchback of SIT spacer layer 501 is then performed, resulting in sidewall spacers 3601 as shown in FIG. 36; the etchback of SIT spacer layer 501 may comprise an anisotropic fluorocarbon etch. SiARC 3402 may be removed during etchback of SIT spacer layer 501. The exposed OPL 206 and 3401 are then removed as shown in FIG. 37, leaving sidewall spacers 3601 (which comprise the mandrel mask), and the FX mask 3701 located on metal hardmask layer 205. A portion of OPL 206 that is located under FX mask 3701 is not removed due to stitching.

Figure 38:
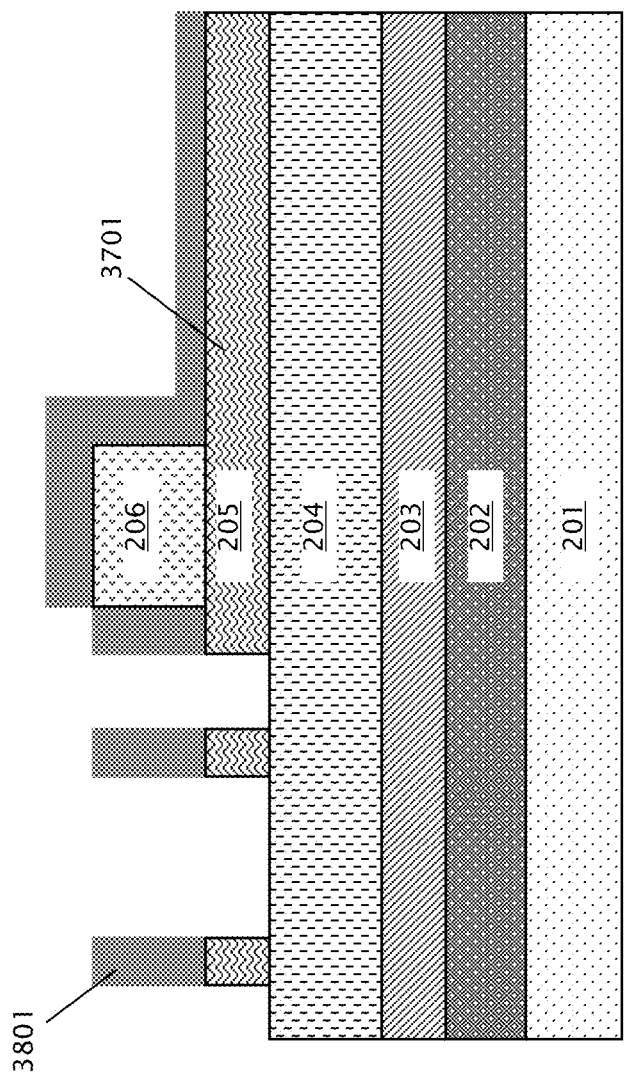
FIG. 38 is a cross sectional view illustrating an embodiment of the device of FIG. 37 after etching the mandrel and FX masks into the metal hardmask layer.
Figure 39:
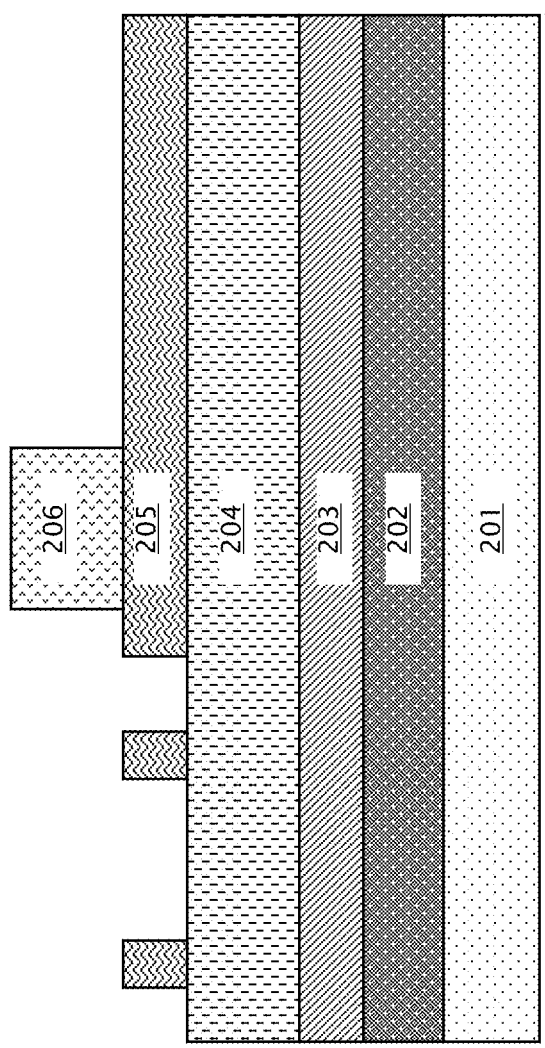
FIG. 39 is a cross sectional view illustrating an embodiment of the device of FIG. 38 after removal of the SIT spacer.

Method 1900 of FIG. 19 then proceeds to block 1902, in which the mandrel mask and FX mask are transferred by etching into the metal hardmask layer. FIG. 38 shows an embodiment of an etched metal hardmask layer 205 into which the mandrell and FX masks have been etched. The sidewall spacers 3601 and the spacer portion of FX mask 3701 are then removed from etched metal hardmask layer 205 as shown in FIG. 39; removal may comprise oxide wet removal in some embodiments, leaving the remaining portion of etched OPL 206 located on etched metal hardmask layer 205.

Figure 40:
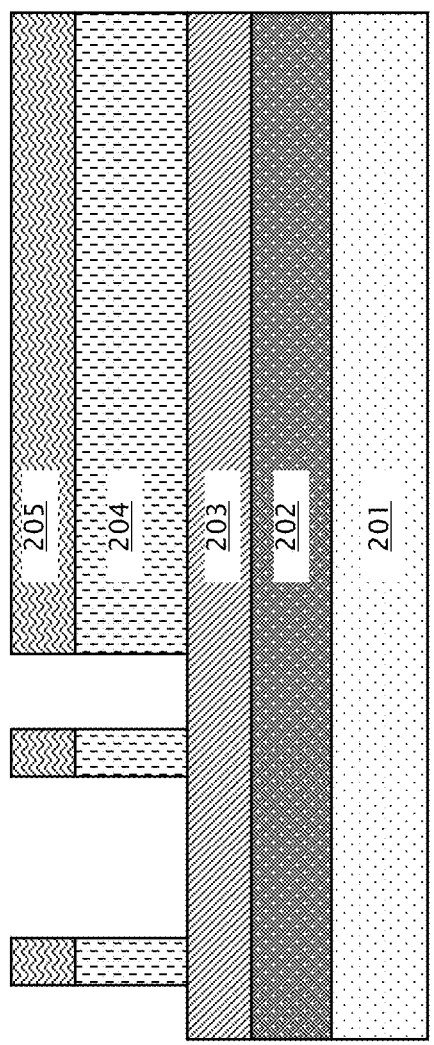
FIG. 40 is a cross sectional view illustrating an embodiment of the device of FIG. 39 after etching the amorphous carbon layer, and removal of the remaining OPL.
Figure 41:
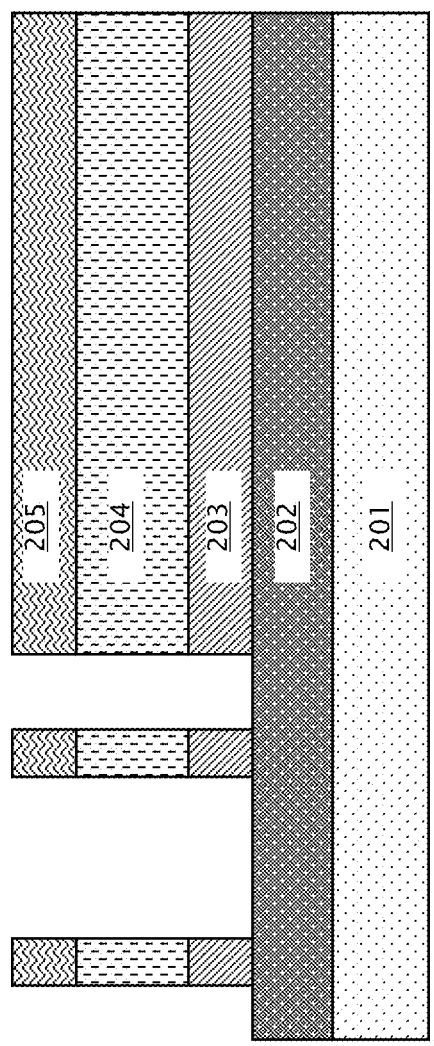
FIG. 41 is a cross sectional view illustrating an embodiment of the device of FIG. 40 after etching of the thermal silicon oxide layer.
Figure 42:
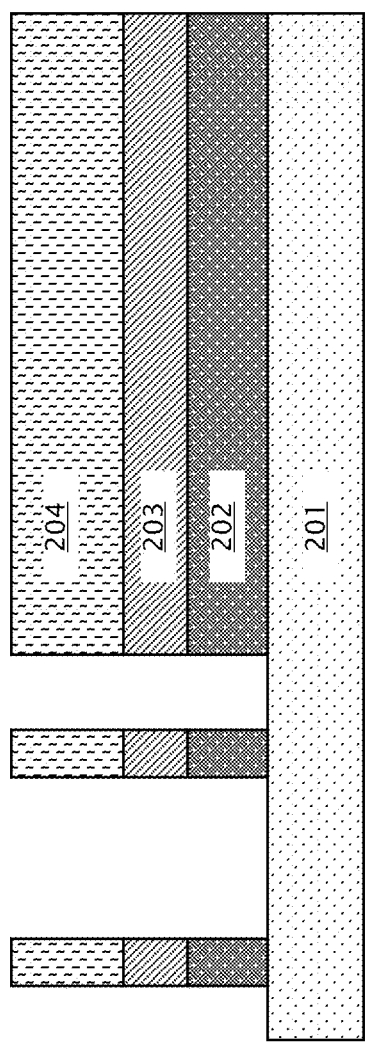
FIG. 42 is a cross sectional view illustrating an embodiment of the device of FIG. 41 after etching the mandrel and FX masks into the SOI layer.
Figure 43:
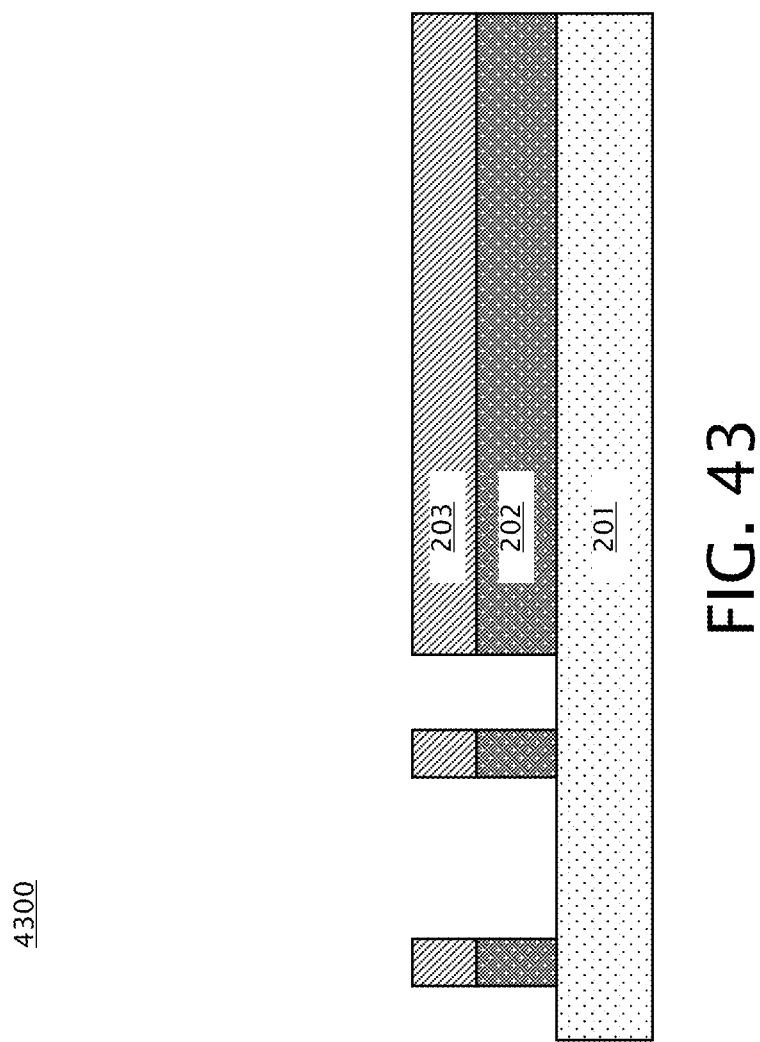
FIG. 43 is a cross sectional view illustrating an embodiment of the device of FIG. 42 after removal of the amorphous carbon layer.

After the mandrel and FX masks are etched into the metal hardmask layer, then, referring again to method 1900 of FIG. 19, the etched metal hardmask layer is used to transfer the mandrel and FX masks into the SOI layer in block 1903. An embodiment of a process flow for mask transfer into the SOI as is performed in block 1903 is illustrated with respect to FIGS. 40-43. First, as shown in FIG. 40, the amorphous carbon layer 204 is etched using the etched metal hardmask layer 205 as a mask. The remaining OPL 206 is removed during the etch of amorphous carbon layer 204. Then, as shown in FIG. 41, the thermal oxide layer 203 is etched using the etched amorphous carbon layer 204 and the etched metal hardmask layer 205 as a mask. Then, as shown in FIG. 42, the SOI layer 202 is etched. The etched metal hardmask layer 205 may be removed during the etching of SOI layer 202. Finally, as shown in FIG. 43, the remaining portion of amorphous carbon layer 204 is removed, leaving device 4300 of FIG. 43, which includes a thermal oxide layer 203 and SOI layer 202 into which mandrel and FX masks have been simultaneously etched. Simultaneous etching of the various masks into the SOI 202 maintains the integrity of the thermal oxide layer 203.

Figure 44:
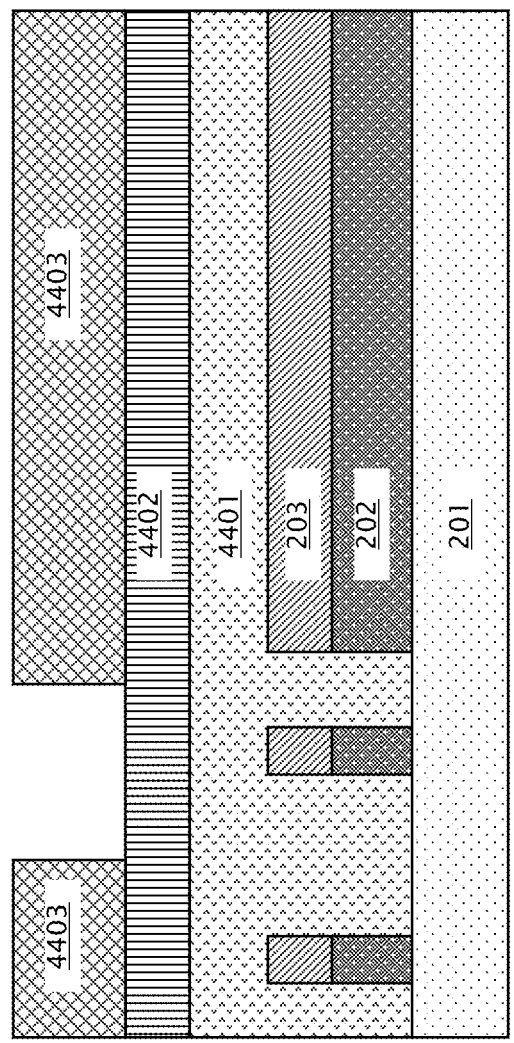
FIG. 44 is a cross sectional view illustrating an embodiment of the device of FIG. 43 after deposition of OPL, SiARC, and photoresist corresponding to a cut mask.
Figure 45:
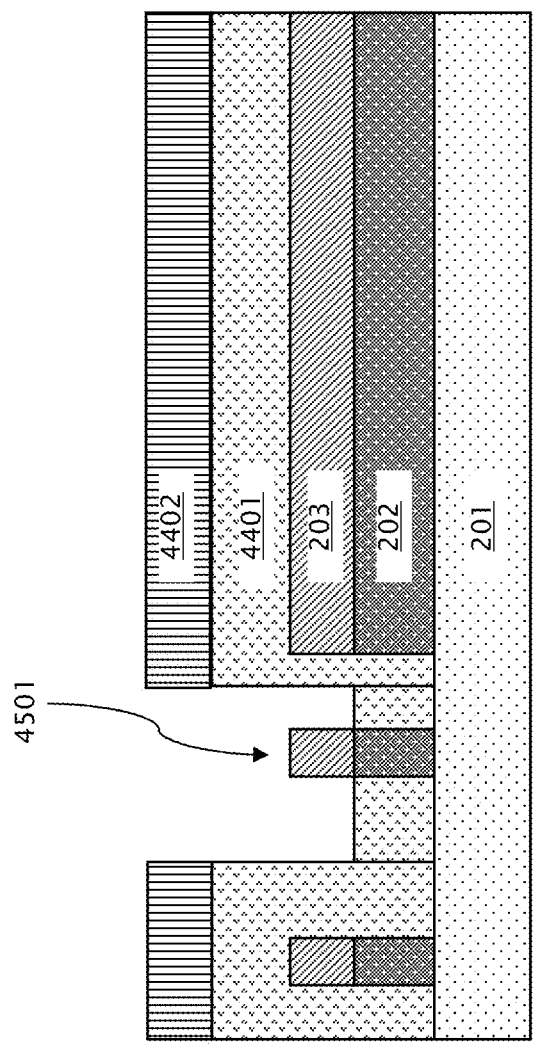
FIG. 45 is a cross sectional view illustrating an embodiment of the device of FIG. 44 after etching of the SiARC and the OPL, and removal of the photoresist.
Figure 46:
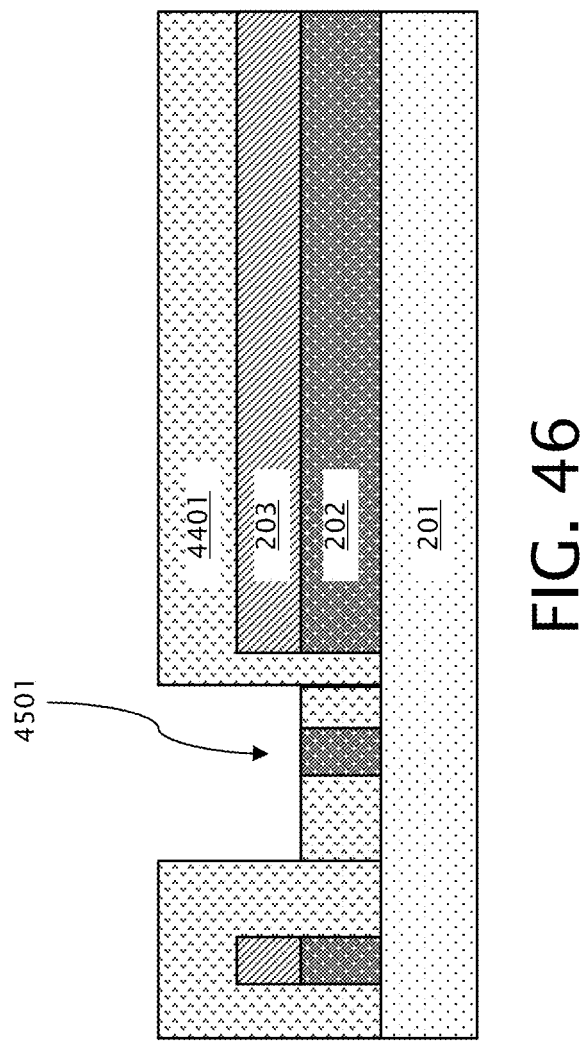
FIG. 46 is a cross sectional view illustrating an embodiment of the device of FIG. 45 after removal of a thermal silicon oxide portion of an unnecessary feature.
Figure 47:
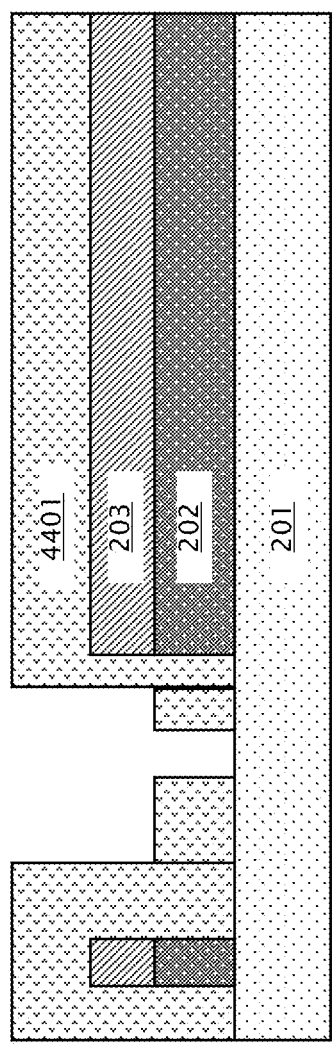
FIG. 47 is a cross sectional view illustrating an embodiment of the device of FIG. 46 after removal of a SOI portion of the unnecessary feature.

Turning again to method 1900 of FIG. 19, in block 1904 a cut mask is formed to remove any unnecessary features that were formed by the mandrel and/or FX masks. An embodiment of a process flow for cut mask formation as is performed in block 1904 is illustrated with respect to FIGS. 44-48. First, as shown in FIG. 44, OPL 4401, SiARC 4402, and photoresist 4403 are deposited over the etched SOI 202 and thermal oxide layer 203. Then, as shown in FIG. 45, the OPL 4401 and SiARC 4402 are etched to expose any unnecessary features, such as feature 4501, in etched SOI 202 and thermal oxide layer 203. The SiARC etch may include a fluorocarbon etch in some embodiments. The OPL etch may contain an oxygen-containing plasma, such as $O_2$, $CO_2/CO$, $CO_2/N_2$, or a non-oxygen containing plasma, such as $H_2/N_2$ mixture. The patterned photoresist 4403 acts as the masking layer for SiARC 4402 etch, and may be removed during the etch of OPL 4401. The exposed features such as feature 4501 are then removed, as shown in FIGS. 46-47. The top thermal oxide portion of the exposed features may be removed first (FIG. 46), and then the bottom SOI portion (FIG. 47). The SiARC layer 4402 may also be removed during the removal of the thermal oxide portion of the exposed features. Lastly, as shown in FIG. 48, the remaining OPL 4401 is removed, leaving device 4800, on which FinFETs having relatively low thermal oxide thickness variation may be formed.

The technical effects and benefits of exemplary embodiments include formation of FinFETs by SIT with relatively low thermal oxide thickness variation, which may increase the yield for a fabrication process for devices including FinFETs.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method for formation of a fin field effect transistor (FinFET) device, the method comprising:
    forming a mandrel mask on a metal hardmask layer of a film stack, the film stack including a silicon on insulator (SOI) layer located underneath the metal hardmask layer;
    forming a large feature (FX) mask on the metal hardmask layer after formation of the mandrel mask;
    etching the mandrel mask and the FX mask simultaneously into the metal hardmask layer;
    etching the mandrel mask and the FX mask into the SOI layer using the etched metal hardmask layer as a mask.

2. The method of claim 1, further comprising forming a cut mask on the metal hardmask layer before etching the mandrel mask and the FX mask into the metal hardmask layer, wherein the cut mask is configured to remove a portion of the mandrel mask or the FX mask corresponding to an unnecessary feature.

3. The method of claim 1, wherein the metal hardmask layer comprises titanium nitride (TiN).

4. The method of claim 1, wherein the mandrel mask and the FX mask are formed with stitching.

5. The method of claim 1, wherein the mandrel mask and the FX mask are formed without stitching.

6. The method of claim 1, wherein forming the mandrel mask comprises:
    forming a plurality of mandrels on the metal hardmask layer;
    depositing a sidewall image transfer (SIT) spacer layer over the plurality of mandrels and on the metal hardmask layer;
    performing etchback of the SIT spacer layer to expose top surfaces of the plurality of mandrels; and
    removing the plurality of mandrels, wherein a portion of the SIT spacer layer that remains on the metal hardmask layer comprises the mandrel mask.

7. The method of claim 6, wherein the SIT spacer layer comprises one of silicon oxide and silicon nitride, and is deposited by conformal deposition.

8. The method of claim 6, wherein the FX mask is formed on the metal hardmask layer after the plurality of mandrels are removed.

9. The method of claim 6, wherein the FX mask is formed on the SIT spacer layer before etchback of the SIT spacer layer is performed such that a portion of the SIT spacer layer comprises the FX mask.

10. The method of claim 1, wherein the etched metal hardmask layer is removed during etching of the mandrel mask and the FX mask into the SOI layer.

11. The method of claim 10, further comprising forming a cut mask over the etched SOI layer after etching the mandrel mask and the FX mask into the SOI layer, wherein the cut mask is configured to remove an unnecessary feature formed by the mandrel mask or the FX mask in the SOI layer.

12. The method of claim 1, wherein the film stack further comprises:
    a buried oxide (BOX) layer located underneath the SOI layer;
    a thermal silicon oxide layer located on top of the SOI layer;

an amorphous carbon layer located on top of the thermal silicon oxide layer and underneath the metal hardmask layer.

13. The method of claim 12, wherein the mandrel mask and the FX mask are etched into the amorphous carbon layer and the thermal silicon oxide layer using the etched metal hardmask layer as a mask before etching the mandrel mask and the FX mask into the SOI layer.

14. The method of claim 13, further comprising removing the amorphous carbon layer after etching the mandrel mask and the FX mask into the SOI layer.

15. A film stack for formation of a fin field effect transistor (FinFET) device, comprising:
- a buried oxide (BOX) layer;
- a silicon on insulator (SOI) layer located on the BOX layer;
- a thermal silicon oxide layer located on top of and in direct contact with the SOI layer;
- an amorphous carbon layer located on top of the thermal silicon oxide layer; and
- a metal hardmask layer located on top of the amorphous carbon layer.

16. The film stack of claim 15, wherein the metal hardmask layer comprises titanium nitride (TiN).

17. The film stack of claim 15, wherein a mandrel mask and a large feature (FX) mask are etched into the metal hardmask layer, and wherein the etched metal hardmask layer is configured to be used as a mask to etch the mandrel mask and the FX mask into the SOI layer.

18. The film stack of claim 15, further comprising a plurality of mandrels corresponding to a mandrel mask located on the metal hardmask layer.

19. The film stack of claim 18, further comprising a sidewall image transfer (SIT) spacer layer located over the plurality of mandrels and the metal hardmask layer.

20. The film stack of claim 19, wherein the SIT spacer layer comprises one of silicon oxide and silicon nitride.

* * * * *